US006836172B2

(12) United States Patent
Okashita

(10) Patent No.: US 6,836,172 B2
(45) Date of Patent: Dec. 28, 2004

(54) SEMICONDUCTOR SWITCH APPARATUS INCLUDING ISOLATED MOS TRANSISTORS

(75) Inventor: Tomonori Okashita, Kanagawa (JP)

(73) Assignee: NEC Compound Semiconductor Devices, Ltd., Kawasaki (JP)

( * ) Notice: Subject to any disclaimer, the term of this patent is extended or adjusted under 35 U.S.C. 154(b) by 0 days.

(21) Appl. No.: 10/443,007

(22) Filed: May 22, 2003

(65) Prior Publication Data

US 2003/0222704 A1 Dec. 4, 2003

(30) Foreign Application Priority Data

May 30, 2002 (JP) ......................................... 2002-156602

(51) Int. Cl.[7] .............................................. H03K 17/30
(52) U.S. Cl. ...................................... 327/382; 327/564
(58) Field of Search ......................... 327/382, 564–566; 257/347, 348, 350, 360

(56) References Cited

U.S. PATENT DOCUMENTS

| 5,747,846 | A | * | 5/1998 | Iida et al. ..................... 257/314 |
| 5,818,099 | A |   | 10/1998 | Burghartz |
| 6,094,088 | A |   | 7/2000 | Yano |
| 6,172,378 | B1 | * | 1/2001 | Hull et al. ..................... 257/14 |
| 6,355,537 | B1 | * | 3/2002 | Seefeldt ..................... 438/405 |
| 6,627,954 | B1 | * | 9/2003 | Seefeldt ..................... 257/350 |

FOREIGN PATENT DOCUMENTS

| EP | 0 903 855 A1 | 2/1998 |
| JP | 2000-294786 | 10/2000 |

OTHER PUBLICATIONS

Hisanori Uda et al., "High-Performance GaAs Switch IC's Fabricated Using MESFET's with Two Kinds of Pinch-off Voltages and a Symmetrical Pattern Configuration", IEEE Journal of Solid-State Circuits, IEEE Inc., New York, US, vol. 29, No. 10, Oct. 1, 1994, pp. 1262–1269.

* cited by examiner

Primary Examiner—Kenneth B. Wells
(74) Attorney, Agent, or Firm—McGinn & Gibb, PLLC

(57) ABSTRACT

In a semiconductor switch apparatus including an input terminal, an output terminal, an AC ground terminal, a DC ground terminal, at least one series MOS transistor connected between the input terminal and the output terminal, and at least one shunt MOS transistor connected between one of the input terminal and the output terminal and the AC ground terminal, the series MOS transistor is formed within a first region of a semiconductor layer on a silicon-on-insulator configuration surrounded by a first trench insulating layer, and the shunt MOS transistor is formed within a second region of the semiconductor layer surrounded by a second trench insulating layer.

13 Claims, 23 Drawing Sheets

SEMICONDUCTOR SWITCH APPARATUS INCLUDING ISOLATED MOS TRANSISTORS

BACKGROUND OF THE INVENTION

1. Field of the Invention

The present invention relates to a semiconductor switch apparatus for radio frequency signals.

2. Description of the Related Art

In a mobile communication apparatus such as a mobile telephone apparatus using radio frequency signals such as GHz microwave signals, semiconductor switch apparatuses are used for switching the operation of an antenna circuit and a receiving and transmitting circuit.

A prior art semiconductor switch apparatus using GaAs FETs is very simple and therefore, can be constructed by one semiconductor chip. That is, since the GaAs FETs serve as passive elements such as resistors and capacitors, bias circuits for the GaAs FETs are unnecessary. Also, since a substrate of the GaAs FETs is made of semi-insulating material having a high resistance, the leakage of radio frequency signals via the substrate can be suppressed. This will be explained later in detail.

In the above-described prior art semiconductor switch apparatus using GaAs FETs, however, since GaAs substrates are expensive, the manufacturing cost is very high.

In another prior art semiconductor switch apparatus using silicon MOS transistors, in order to suppress the leakage of radio frequency signals, a silicon-on-insulator (SOI) configuration is adopted (see: JP-A-2000-294786) or a resistor is inserted between the back gate of each of the MOS transistors and a ground terminal (see: U.S. Pat. No. 6,094,088). This also will be explained later in detail.

In the above-described prior art semiconductor switch apparatus using silicon MOS transistors, although the manufacturing cost can be low, suppression of the leakage of radio frequency signals is still insufficient, which also will be explained later in detail.

SUMMARY OF THE INVENTION

It is an object of the present invention to provide a semiconductor switch apparatus using silicon MOS transistors capable of further decreasing the transmission loss of radio frequency signals.

According to the present invention, in a semiconductor switch apparatus including an input terminal, an output terminal, an AC ground terminal, a DC ground terminal, at least one series MOS transistor connected between the input terminal and the output terminal, and at least one shunt MOS transistor connected between one of the input terminal and the output terminal and the AC ground terminal, the series MOS transistor is formed within a first region of a semiconductor layer on an SOI configuration surrounded by a first trench insulating layer, and the shunt MOS transistor is formed within a second region of the semiconductor layer surrounded by a second trench insulating layer.

Thus, the leakage of radio frequency signals from the series MOS transistor to the shunt MOS transistor can be suppressed by the trench insulating layers.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art semiconductor switch apparatuses will be explained with reference to FIGS. 1A, 1B, 2A, 2B, 3, 4, 5 and 6.

Figure 1A:
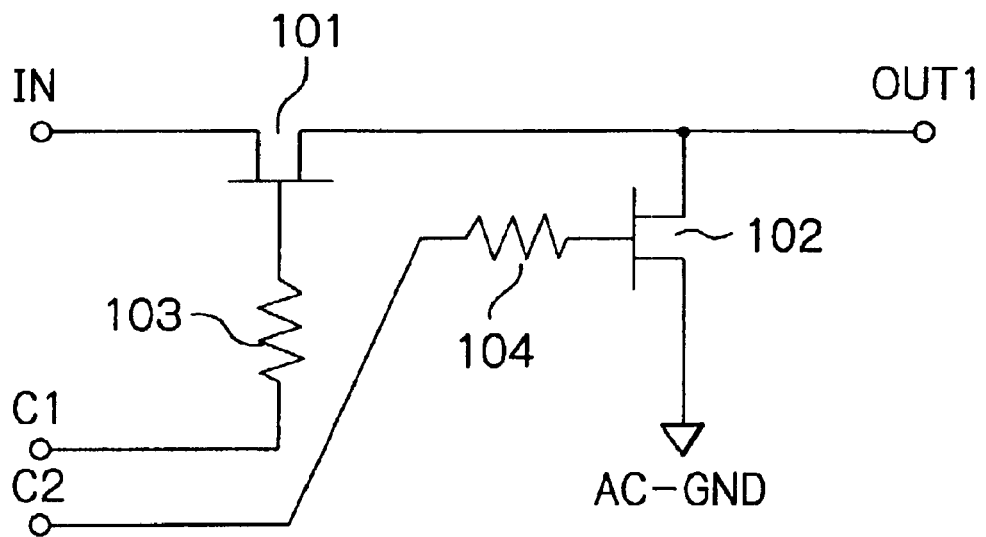
FIG. 1A is an equivalent circuit diagram illustrating a first prior art semiconductor switch apparatus.

In FIG. 1A, which illustrates a first prior art semiconductor switch apparatus, this semiconductor switch apparatus is of a single pole single throw (SPST) type using GaAs technology which is constructed by a series GaAs FET 101 connected between an input terminal IN and an output terminal OUT1, and a shunt GaAs FET 102 connected between the output terminal OUT1 and an AC ground terminal AC-GND. Also, control terminals C1 and C2 are connected via gate protection resistors 103 and 104 to the gates of the GaAs FETs 101 and 102, respectively.

When a high voltage such as 3V is applied to the control terminal C1 and a low voltage such as 0V is applied to the control terminal C2, the FETs 101 and 102 are turned ON and OFF, respectively, so that a radio frequency signal can be transmitted from the input terminal IN via the FET 101 to the output terminal OUT1.

On the other hand, when the low voltage such as 0V is applied to the control terminal C1 and the high voltage such as 3V is applied to the control terminal C2, the FETs 101 and 102 are turned OFF and ON, respectively, so that the output terminal OUT1 is completely short-circuited to the AC ground terminal AC-GND. Thus, the leakage of the radio frequency signal between the input terminal IN and the output terminal OUT1 is suppressed, which improves the isolation characteristics of the FET 101.

Figure 1B:
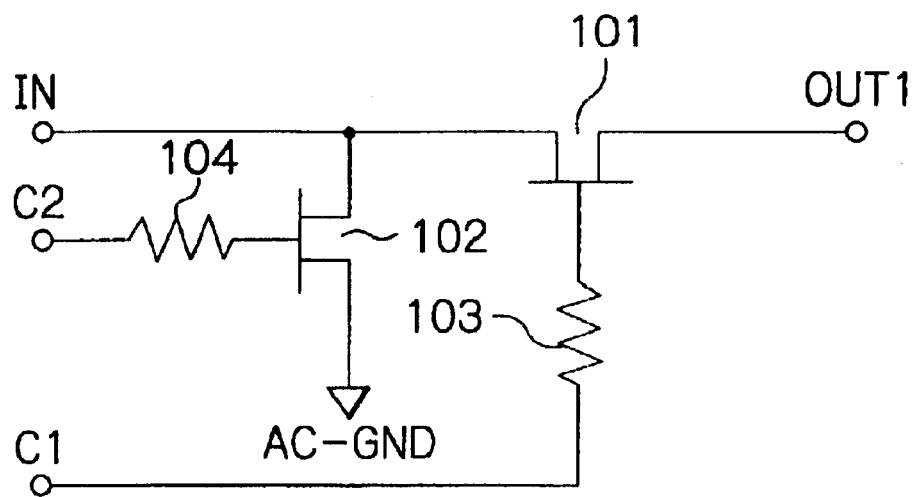
FIG. 1B is an equivalent circuit diagram illustrating a modification of the semiconductor switch apparatus of FIG. 1A.

Note that, as illustrated in FIG. 1B, the shunt FET 102 and the gate protection resistor 104 can be connected to the input terminal IN.

Figure 2A:
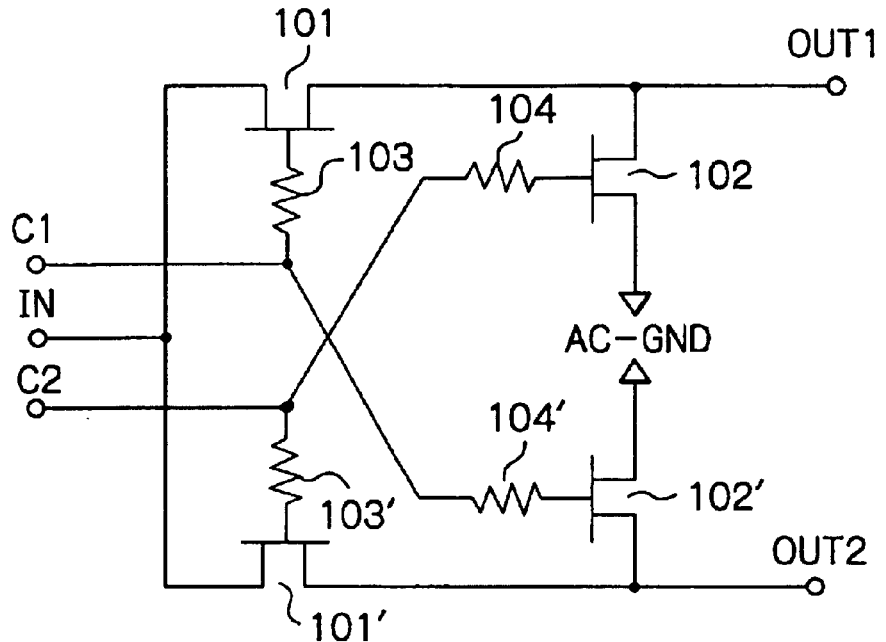
FIG. 2A is an equivalent circuit diagram illustrating a second prior art semiconductor switch apparatus.

In FIG. 2A, which illustrates a second prior art semiconductor switch apparatus, this semiconductor switch apparatus is of a single pole double throw (SPDT) type using GaAs technology which is further constructed by a series GaAs FET 101' connected between the input terminal IN and an output terminal OUT2, and a shunt GaAs FET 102' connected between the output terminal OUT2 and the ground terminal AC-GND in addition to the semiconductor switch apparatus of FIG. 1A. Also, the control terminals C1 and C2 are connected via gate protection resistors 104' and 103 to the gates of the GaAs FETs 102' and 101', respectively.

When a high voltage such as 3V is applied to the control terminal C1 and a low voltage such as 0V is applied to the control terminal C2, the FETs 101 and 102 are turned ON and OFF, respectively, so that a radio frequency signal can be transmitted from the input terminal IN via the FET 101 to the output terminal OUT1. Simultaneously, the FETs 101' and 102' are turned OFF and ON, respectively, so that the output terminal OUT2 is completely short-circuited to the AC ground terminal AC-GND. Thus, the leakage of the radio frequency signal between the input terminal IN and the output terminal OUT2 is suppressed, which improves the isolation characteristics of the FET 101'.

On the other hand, when the low voltage such as 0V is applied to the control terminal C1 and the high voltage such as 3V is applied to the control terminal C2, the FETs 101' and 102' are turned ON and OFF, respectively, so that a radio frequency signal can be transmitted from the input terminal IN via the FET 101' to the output terminal OUT2. Simultaneously, the FETs 101 and 102 are turned OFF and ON, respectively, so that the output terminal OUT1 is completely short-circuited to the AC ground terminal AC-GND. Thus, the leakage of the radio frequency signal between the input terminal IN and the output terminal OUT1 is suppressed, which improves the isolation characteristics of the FET 101.

Figure 2B:
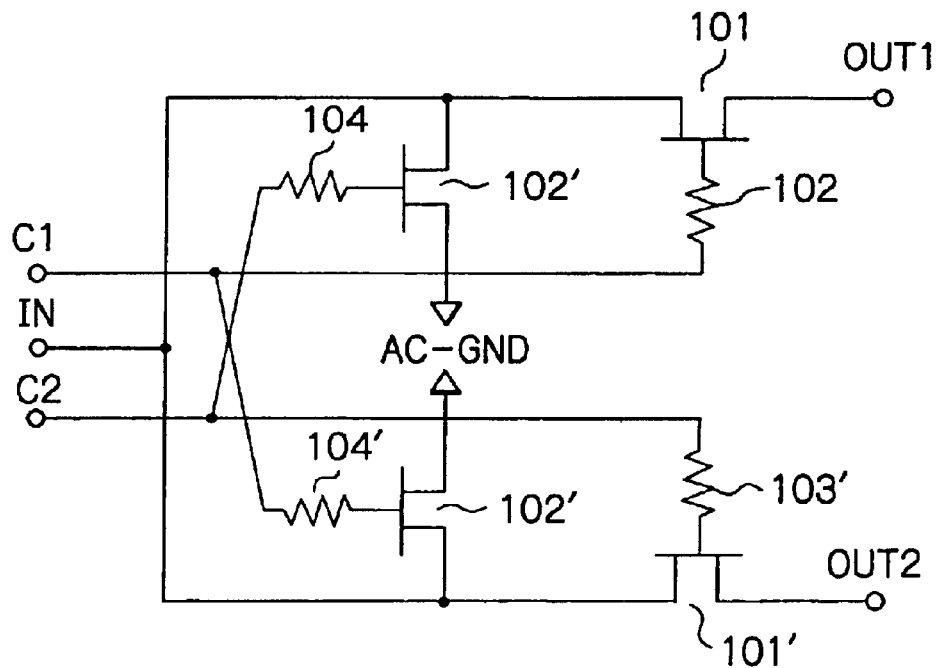
FIG. 2B is an equivalent circuit diagram illustrating a modification of the semiconductor switch apparatus of FIG. 2A.

Note that, as illustrated in FIG. 2B, the shunt FETs 102 and 102' and the gate protection resistors 104 and 104' can be connected to the input terminal IN.

In FIGS. 1A, 1B, 2A and 2B, since the FETs 101, 101', 102 and 102' serve as passive elements such as resistors and capacitors, bias circuits for the FETs 101, 101', 102 and 102' are unnecessary. Also, since a substrate of the GaAs FETs 101, 101', 102 and 102' is made of semi-insulating material having a high resistance, the leakage of radio frequency signals via the substrate can be suppressed.

In the semiconductor switch circuits of FIGS. 1A, 1B, 2A and 2B, however, since GaAs substrates are expensive, the manufacturing cost is very high.

Figure 3:
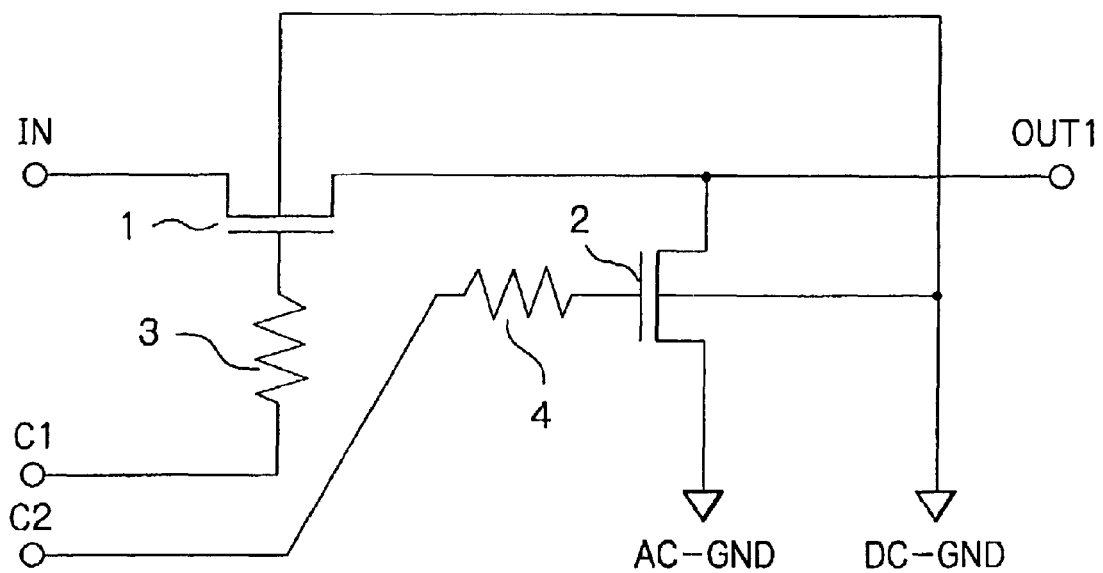
FIG. 3 is an equivalent circuit diagram illustrating a third prior art semiconductor switch apparatus.

In FIG. 3, which illustrates a third prior art semiconductor switch apparatus, this semiconductor switch circuit is of an SPST type using silicon technology which is constructed by a series MOS transistor 1 connected between an input terminal IN and an output terminal OUT1, and a shunt MOS transistor 2 connected between the output terminal OUT1 and an AC ground terminal AC-GND. Also, control terminals C1 and C2 are connected via gate protection resistors 3 and 4 to the gates of the MOS transistors 1 and 2, respectively. Further, the back gates of the MOS transistors 1 and 2 are connected to a DC ground terminal DC-GND, that is, the back gates of the MOS transistors 1 and 2 are directly grounded.

The operation of the semiconductor switch apparatus of FIG. 3 is the same as that of the semiconductor switch apparatus of FIG. 1A.

Figure 4:
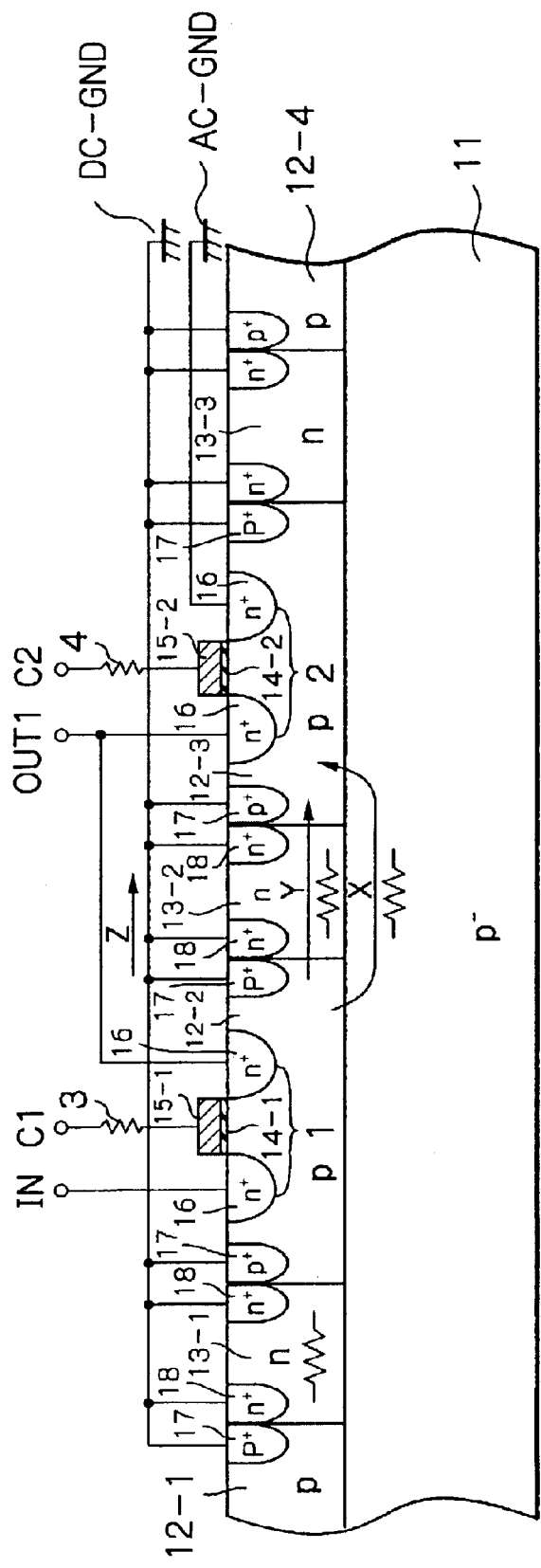
FIG. 4 is a cross-sectional view of the semiconductor switch apparatus of FIG. 3.

The semiconductor switch apparatus of FIG. 3 is of a conventional CMOS switch configuration which is illustrated in FIG. 4.

In FIG. 4, reference numeral 11 designates a p⁻-type monocrystalline silicon substrate having a resistivity of about 10Ω·cm. Also, p-type silicon wells 12-1, 12-2, . . . and n-type silicon wells 13-1, 13-2, . . . are formed on the silicon substrate 11.

In the p-type silicon well 12-2, the series MOS transistor 1 is formed by a gate silicon oxide layer 14-1, a gate electrode layer 15-1 and n⁺-type impurity doped regions 16. Similarly, in the p-type silicon well 12-3, the shunt MOS transistor 2 is formed by a gate silicon oxide layer 14-2, a gate electrode layer 15-2 and n⁺-type impurity doped regions 16.

Also, in the p-type silicon wells 12-1, 12-2, . . . , p⁺-type taken-out regions 17 are formed and connected to the DC ground terminal DC-GND, that is, the back gates of the MOS transistors 1 and 2 are directly grounded. Similarly, in the n-type silicon wells 13-1, 13-2, . . . , n⁺-type taken-out regions 18 are formed and connected to the DC ground terminal DC-GND.

In FIGS. 3 and 4, since the resistivity of the silicon substrate 11 is smaller than that of a GaAs substrate, radio frequency signals are leaked from the p-type silicon well 12-2 via the silicon substrate 11 to the p-type silicon well 12-3 as indicated by X in FIG. 4. Also, radio frequency signals are leaked from the p-type silicon well 12-2 via the n-type silicon well 13-2 to the p-type silicon well 12-3 as indicated by Y in FIG. 4. Further, radio frequency signals are leaked from the p-type silicon wells 12-2 and 12-3 to the DC ground terminal DC-GND as indicated by Z in FIG. 4. Thus, the transmission loss of radio frequency signals is remarkably large.

Figure 5:
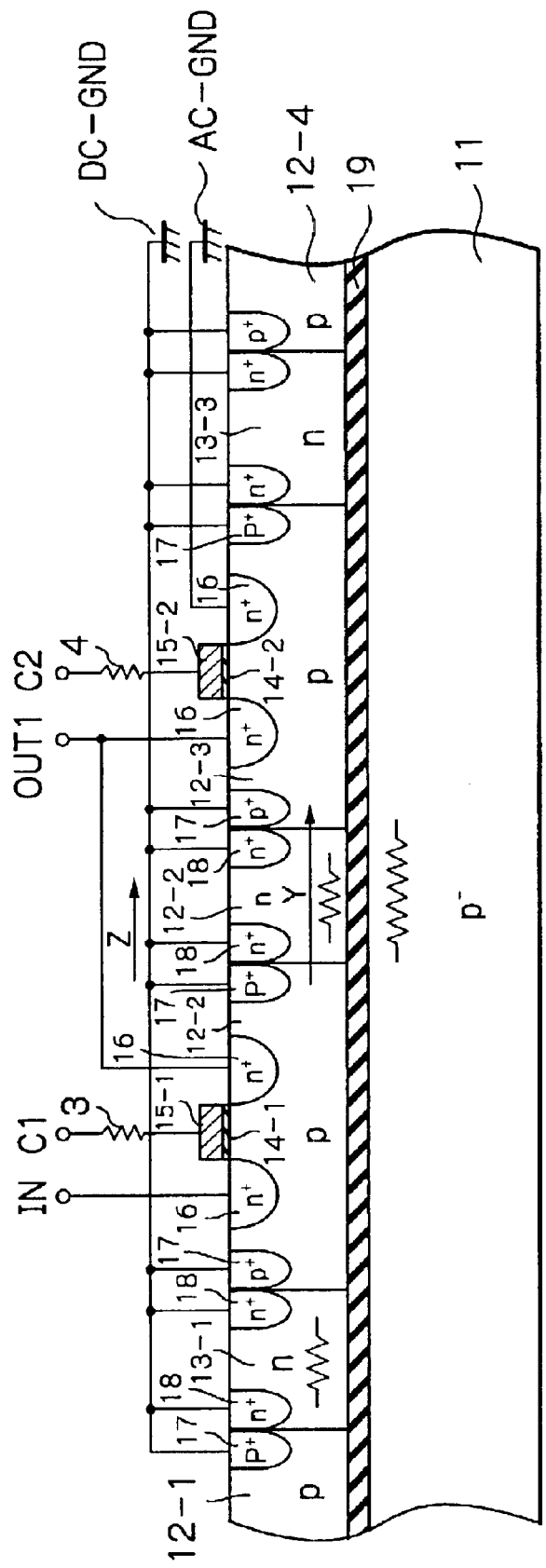
FIG. 5 is a cross-sectional view illustrating a fourth prior art semiconductor switch apparatus.

In order to suppress the leakage of radio frequency signals from the p-type silicon well 12-2 via the silicon substrate 11 to the p-type silicon well 12-3 as indicated by X in FIG. 4, a fourth prior art semiconductor switch apparatus as illustrated in FIG. 5 is known (see: JP-A-2000-294786). That is, a silicon oxide layer 19 is inserted between the silicon substrate 11 and the silicon wells 12-1, 12-2, ..., 13-1, 13-2, ... of FIG. 4, thus realizing an SOI configuration. As a result, since the resistance of the silicon substrate 11 across the silicon oxide layer 19 is substantially increased, the leakage of radio frequency signals via the silicon substrate 11 as indicated by X is FIG. 4 is decreased.

Figure 6:
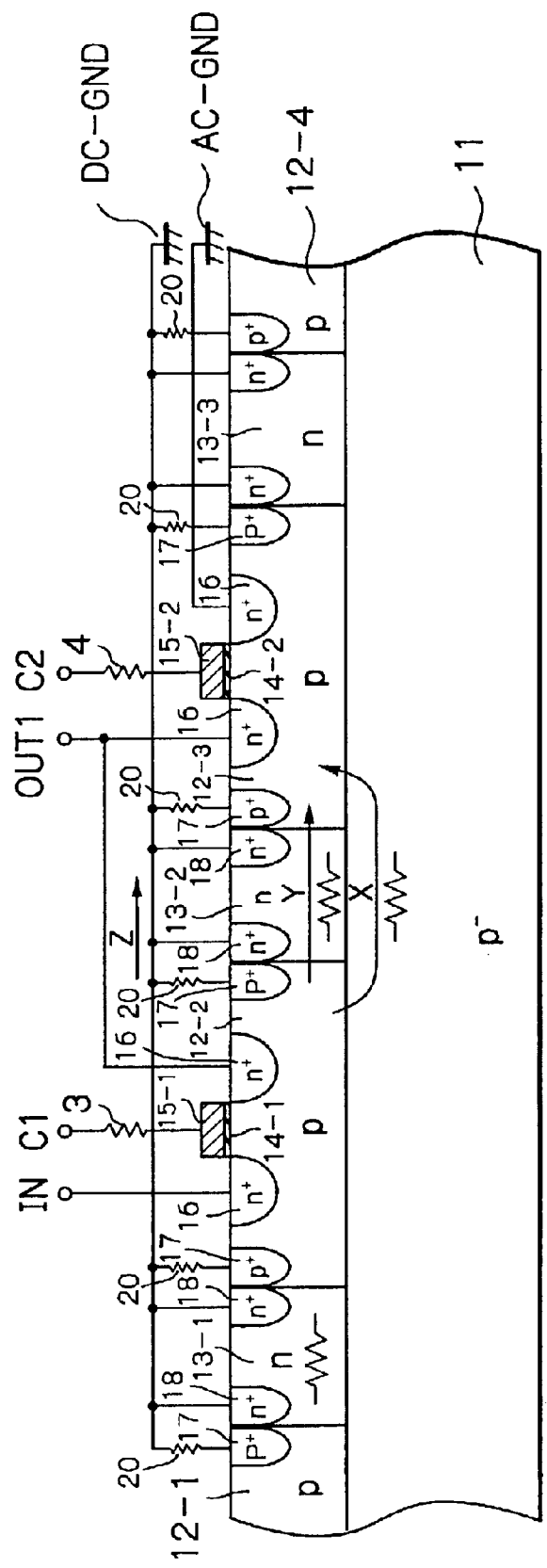
FIG. 6 is a cross-sectional view illustrating a fifth prior art semiconductor switch apparatus.

In order to suppress the leakage of radio frequency signals from the p-type silicon wells 12-2 and 12-3 to the DC ground terminal DC-GND as indicated by Z in FIG. 4, a fifth prior art semiconductor switch apparatus as illustrated in FIG. 6 is known where resistors 20 are inserted between the p⁺-type taken-out regions 17 and the DC ground terminal DC-GND of FIG. 4 (see: U.S. Pat. No. 6,094,088). That is, the back gates of the MOS transistors 1 and 2 are connected via the resistors 20 to the DC ground terminal DC-GND.

Thus, even if the semiconductor switch apparatus of FIG. 5 is combined with that of FIG. 6, the leakage of radio frequency signals from the p-type silicon well 12-2 via the n-type silicon well 13-2 to the p-type silicon well 12-3 as indicated by Y in FIG. 4 cannot be decreased, so that the transmission loss of radio frequency signals is still large.

Figure 7:
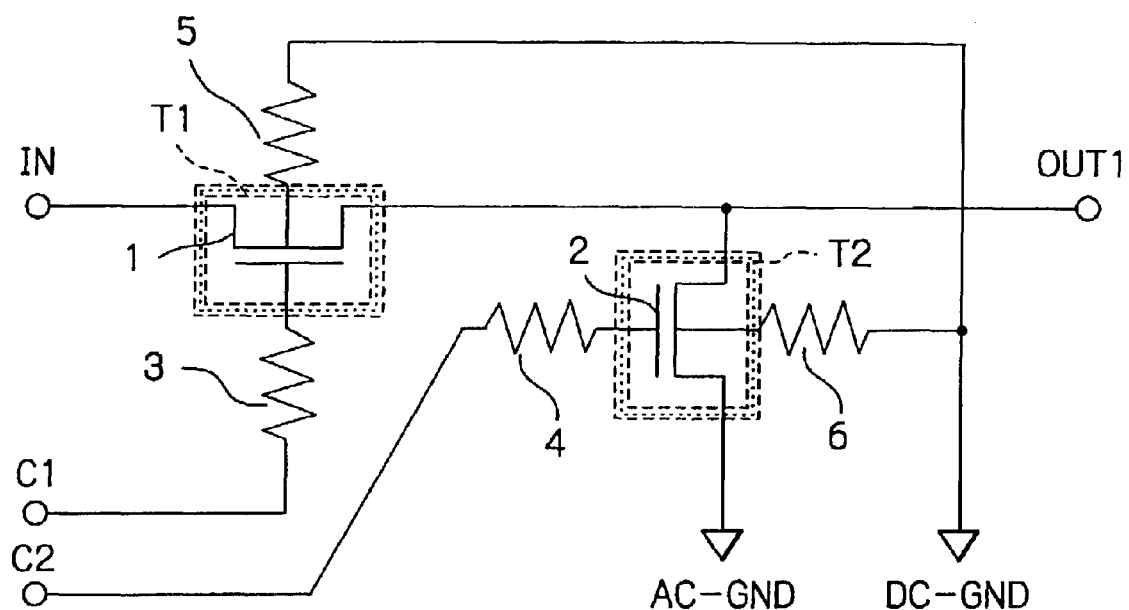
FIG. 7 is an equivalent circuit diagram illustrating a first embodiment of the semiconductor switch apparatus according to the present invention.

In FIG. 7, which illustrates a first embodiment of the semiconductor switch apparatus according to the present invention, a resistor 5 is connected between the back gate of the MOS transistor 1 and the DC ground terminal DC-GND of FIG. 3, and a resistor 6 is connected between the back gate of the MOS transistor 2 and the DC ground terminal DC-GND of FIG. 3. Note that the resistors 5 and 6 correspond to the resistor 20 of FIG. 6.

Also, the MOS transistor 1 is isolated by a trench insulating layer T1 from the other elements, and the MOS transistor 2 is isolated by a trench insulating layer T2 from the other elements. In this case, the resistors 5 and 6 are as close as possible to the MOS transistors 1 and 2, respectively, thus preventing radio frequency signals from superposing on each other.

Figure 8:
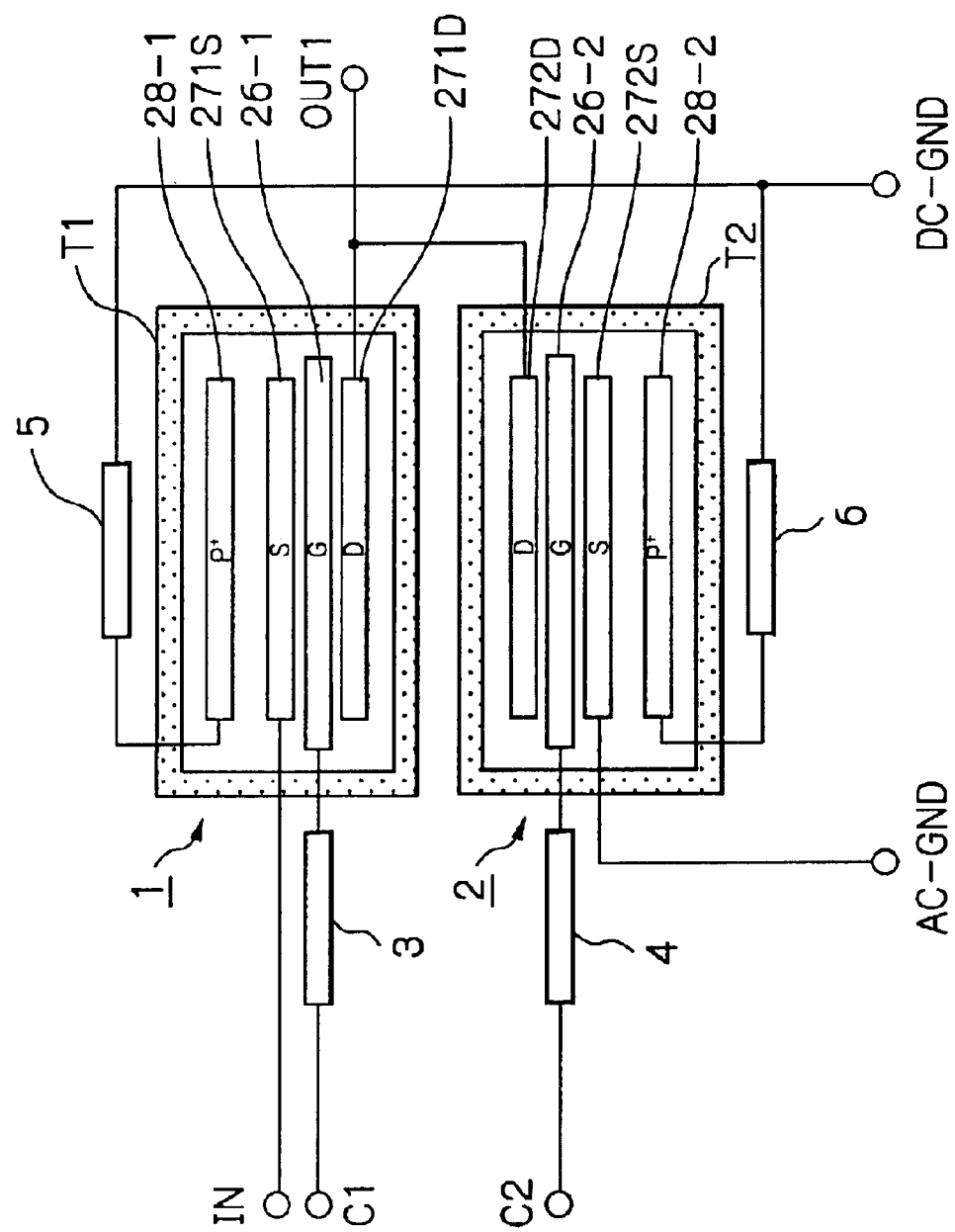
FIG. 8 is a plan view of the semiconductor switch apparatus of FIG. 7.

The semiconductor switch apparatus of FIG. 7 will be explained next with reference to FIGS. 8 and 9. Note that FIG. 8 is a plan view of the semiconductor switch apparatus of FIG. 7 and FIG. 9 is a cross-sectional view of the semiconductor switch apparatus of FIG. 7.

Figure 9:
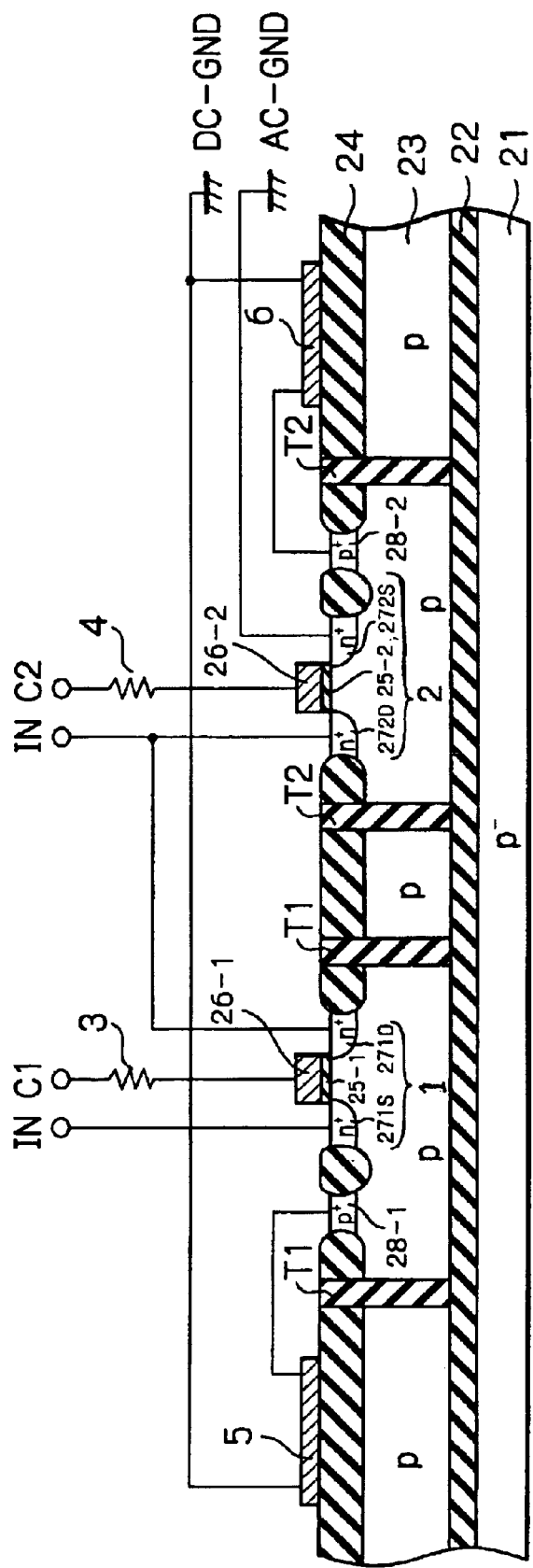
FIG. 9 is a cross-sectional view of the semiconductor switch apparatus of FIG. 7.

In FIG. 9, reference numeral 21 designates a monocrystalline silicon substrate 21 on which a silicon oxide layer 22 is formed. Also, a p-type silicon layer 23 is grown on the silicon oxide layer 22, thus realizing an SOI configuration.

A field silicon oxide layer 24 is formed on the silicon layer 23 by a local oxidation of silicon (LOCOS) process.

Trench insulating layers T1 and T2 are buried in trenches (grooves) in the field silicon oxide layer 24 and the silicon layer 23. For example, a photoresist pattern for the trenches is formed in the field silicon oxide layer 24 and the silicon layer 23 by a photolithography process. Then, a plasma dry etching process is performed upon the field silicon oxide layer 24 and the silicon layer 23 using the photoresist pattern as a mask. Finally, a silicon oxide layer is buried in the trenches.

In an area surrounded by the trench insulating layer T1, a gate insulating layer 25-1, a gate electrode layer 26-1, n⁺-type impurity doped regions 271S and 271D, and a p⁺-type taken-out region 28-1 are formed to realize the series MOS transistor 1. Similarly, in an area surrounded by the insulating trench layer T2, a gate insulating layer 25-2, a gate electrode layer 26-2, n⁺-type impurity doped regions 272S and 272D, and a p⁺-type taken-out region 28-2 are formed to realize the shunt MOS transistor 2.

Further, a polycrystalline silicon layer is deposited on the field silicon oxide layer 24 and patterned to form the resistors 5 and 6 as well as the gate protection resistors 3 and 4.

In FIGS. 8 and 9, since the SOI configuration is adopted, the leakage of radio frequency signals from the p-type silicon layer 23 surrounded by the trench insulating layer T1 for the series MOS transistor 1 via the silicon substrate 21 to the p-type silicon layer 23 surrounded by the trench insulating layer T2 for the shunt MOS transistor 2 can be suppressed.

Also, in FIGS. 8 and 9, since the series MOS transistor 1 is surrounded by the trench insulating layer T1 and the shunt MOS transistor 2 is surrounded by the trench insulating trench layer T2, the leakage of radio frequency signals from the p-type silicon layer 23 surrounded by the trench insulating layer T1 for the series MOS transistor 1 via the p-type silicon layer 23 between the trench insulating layers T1 and T2 to the p-type silicon layer 23 surrounded by the trench insulating layer T2 for the shunt MOS transistor 2 can be suppressed.

Further, in FIGS. 8 and 9, since the resistor 5 is inserted between the silicon layer 23 surrounded by the trench insulating layer T1 and the DC ground terminal DC-GND, and the resistor 6 is inserted between the silicon layer 23 surrounded by the trench insulating layer T2 and the DC ground terminal DC-GND, the leakage of radio frequency signals from the silicon layer 23 surrounded by the trench insulating layers T1 and T2 to the DC ground terminal DC-GND can be suppressed.

Figure 10:
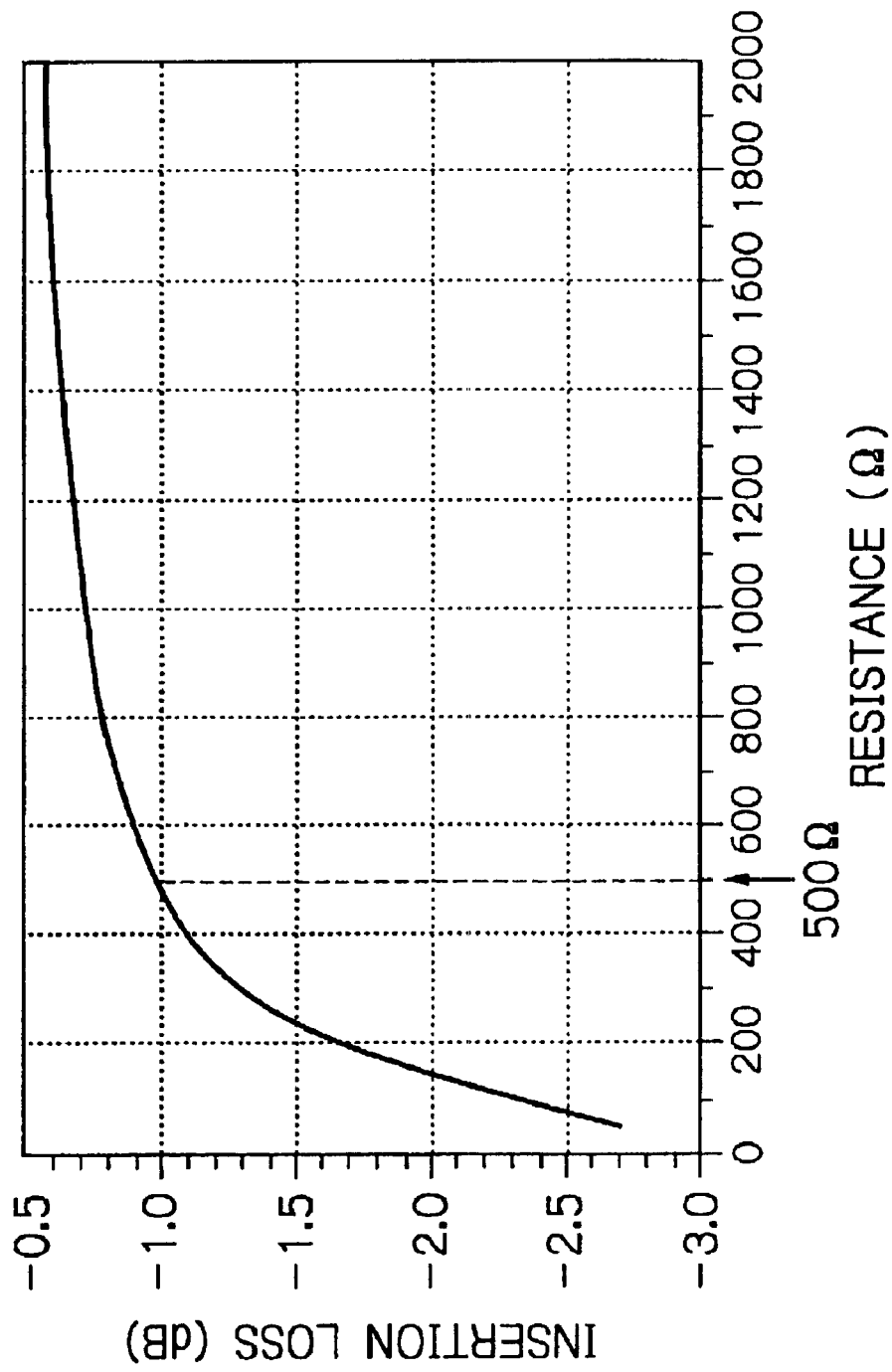
FIG. 10 is a graph showing the insertion loss characteristics with respect to the resistance value of the resistors of FIGS. 8 and 9.

As shown in FIG. 10, which shows the insertion loss characteristics (the input to output voltage ratio characteristics) with respect to the resistance value of the resistors 5 and 6, the larger the resistance value, the smaller the leakage current to the DC ground terminal DC-GND and the smaller the insertion loss. Generally, the insertion loss is less than 1 dB in view of the characteristics of the semiconductor switch apparatus. Therefore, the resistance value is preferably larger than about 500Ω. On the other hand, although the operating range of the semiconductor switch apparatus depends on the circuit elements connected thereto and the grounding method of the DC ground terminal DC-GND, if the resistance value is larger than about 10MΩ, the operation of the semiconductor switch apparatus becomes unstable in a DC manner. Thus, the resistance value of the resistors 5 and 6 is preferably about 500Ω to 10MΩ.

Figure 11:
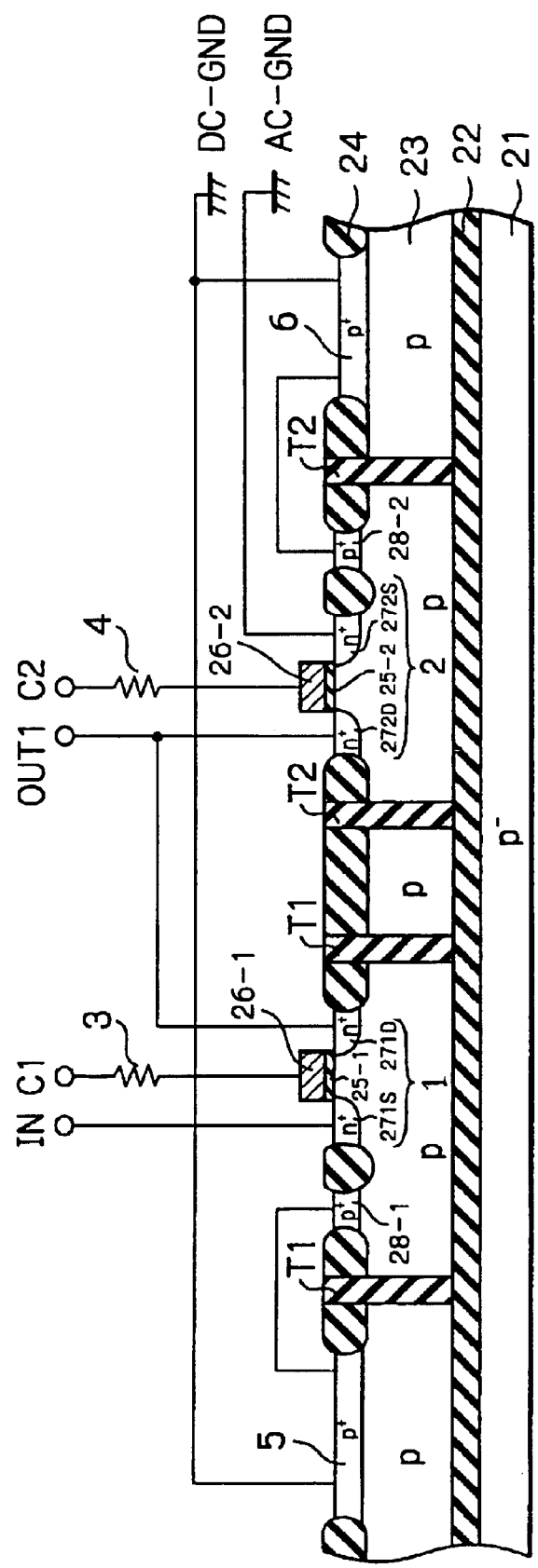
FIG. 11 is a cross-sectional view illustrating a modification of the semiconductor switch apparatus of FIG. 9.

In FIG. 11, which is a modification of the semiconductor switch apparatus of FIG. 9, the resistors 5 and 6 are formed by p⁺-type impurity doped regions in the silicon layer 23. For example, openings having a predetermined size are perforated in the filed silicon oxide layer 24 by a photolithography and etching process, and then, 1E+15 boron ions/cm² are implanted into the silicon layer 23 at an energy of 30 keV.

Figure 12:
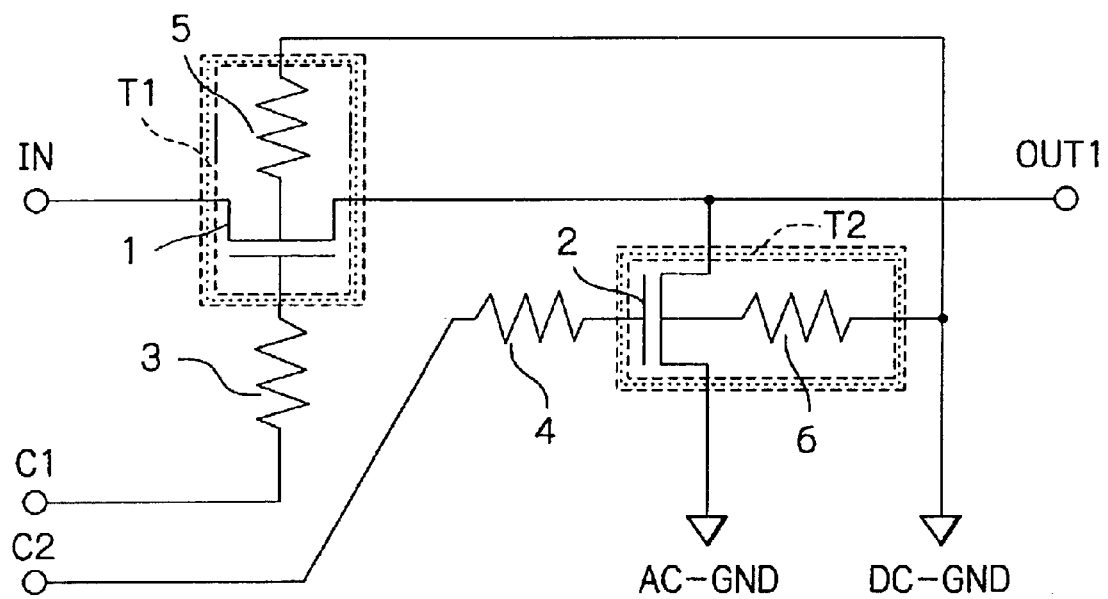
FIG. 12 is an equivalent circuit diagram illustrating a second embodiment of the semiconductor switch apparatus according to the present invention.

In FIG. 12, which illustrates a second embodiment of the semiconductor switch apparatus according to the present invention, the resistor 5 as well as the MOS transistor 1 is isolated by the trench insulating layer T1, and the resistor 6 as well as the MOS transistor 2 is isolated by the trench insulating layer T2, thus surely preventing radio frequency signals from superposing on each other.

Figure 13:
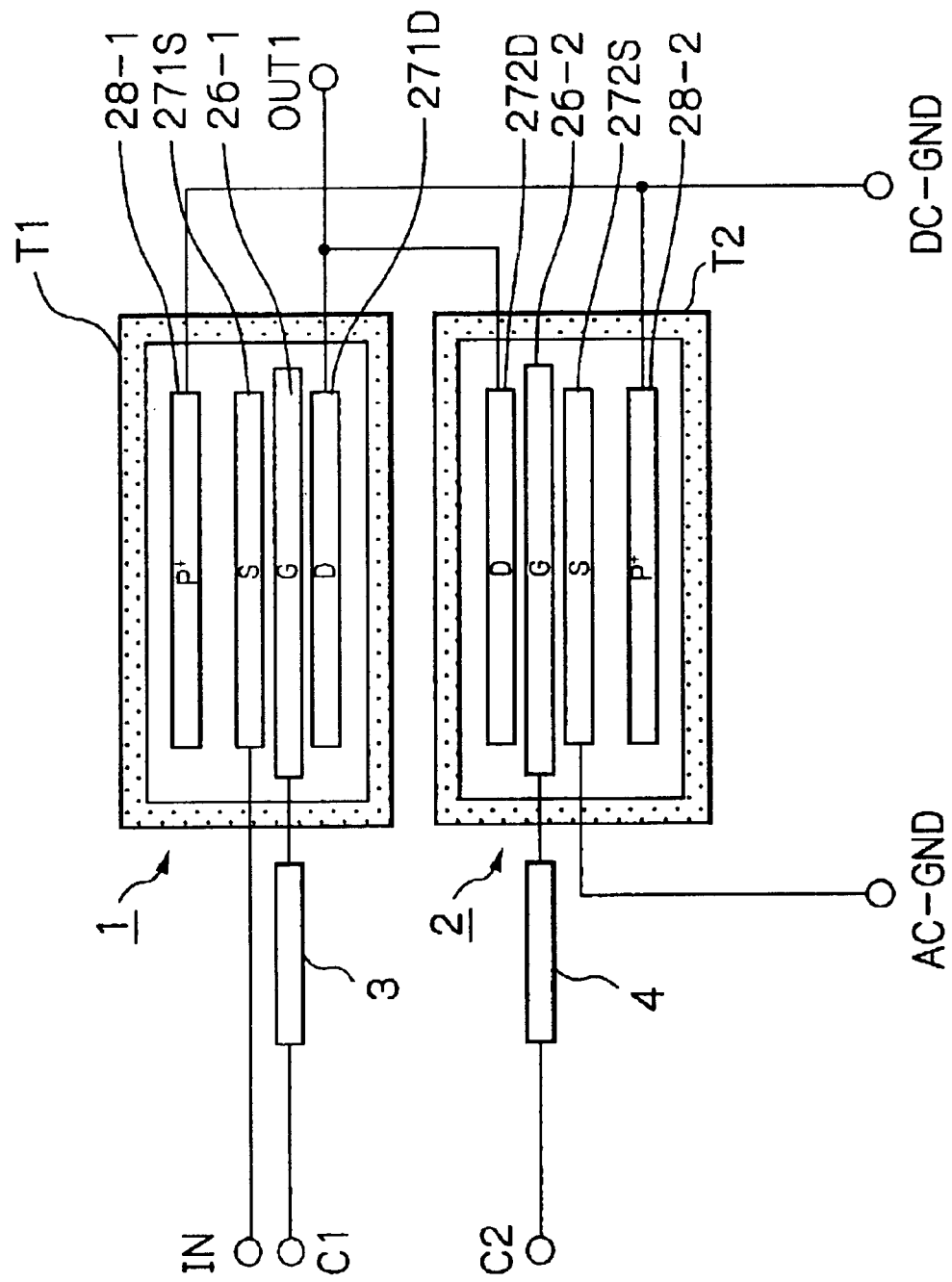
FIG. 13 is a plan view of the semiconductor switch apparatus of FIG. 12.
Figure 14:
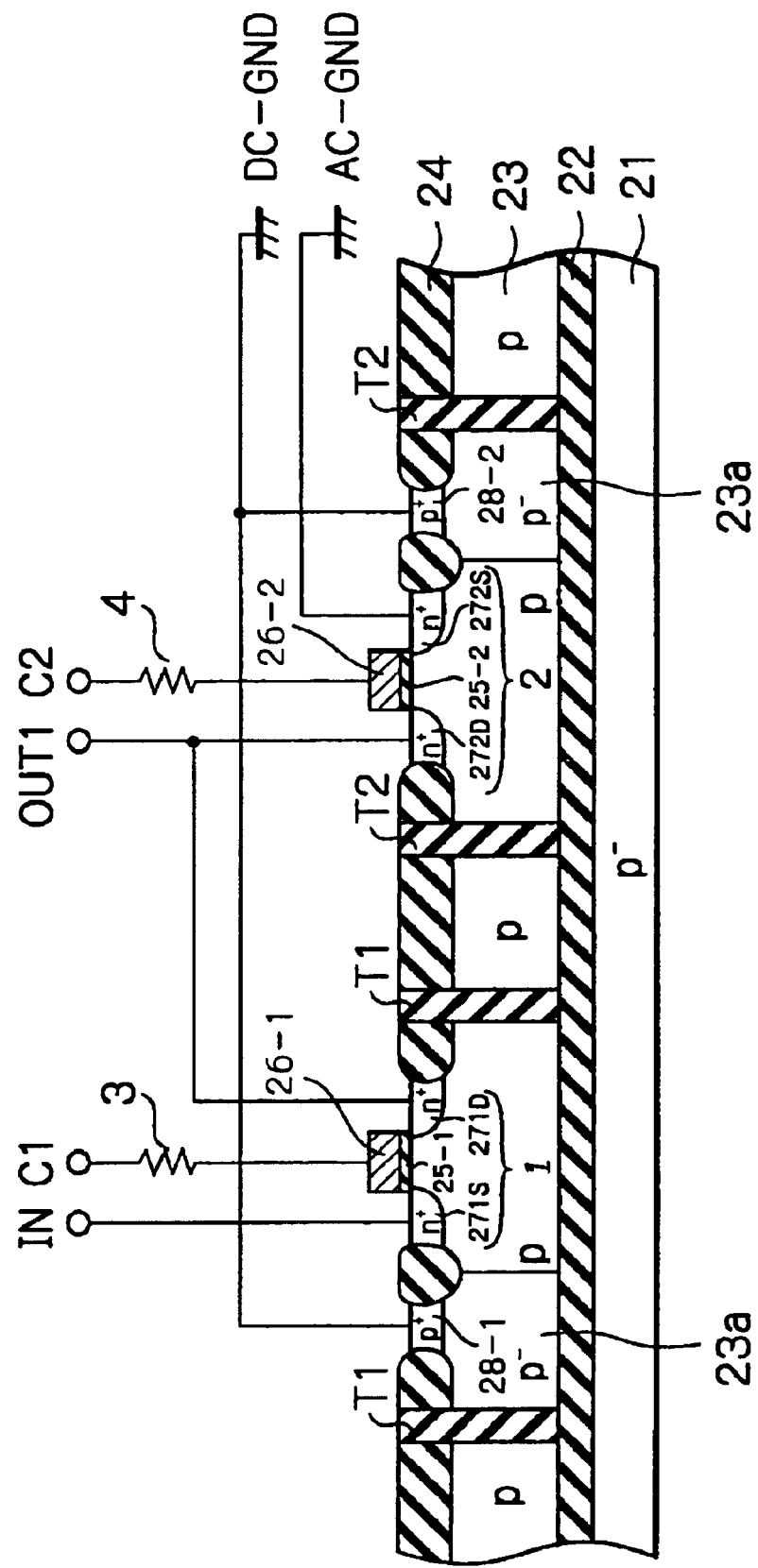
FIG. 14 is a cross-sectional view of the semiconductor switch apparatus of FIG. 12.

As illustrated in FIGS. 13 and 14 which are a plan view and a cross-sectional view, respectively, of the semiconductor switch apparatus of FIG. 12, the impurity concentration of regions 23a of the silicon layer 23 under the p⁺-type taken-out regions 28-1 and 28-2 is made smaller than that of the other region of the p⁺-type taken-out regions 28-1 and 28-2. Thus, the regions 23a serve as the resistors 5 and 6 of FIGS. 8 and 9.

Figure 15:
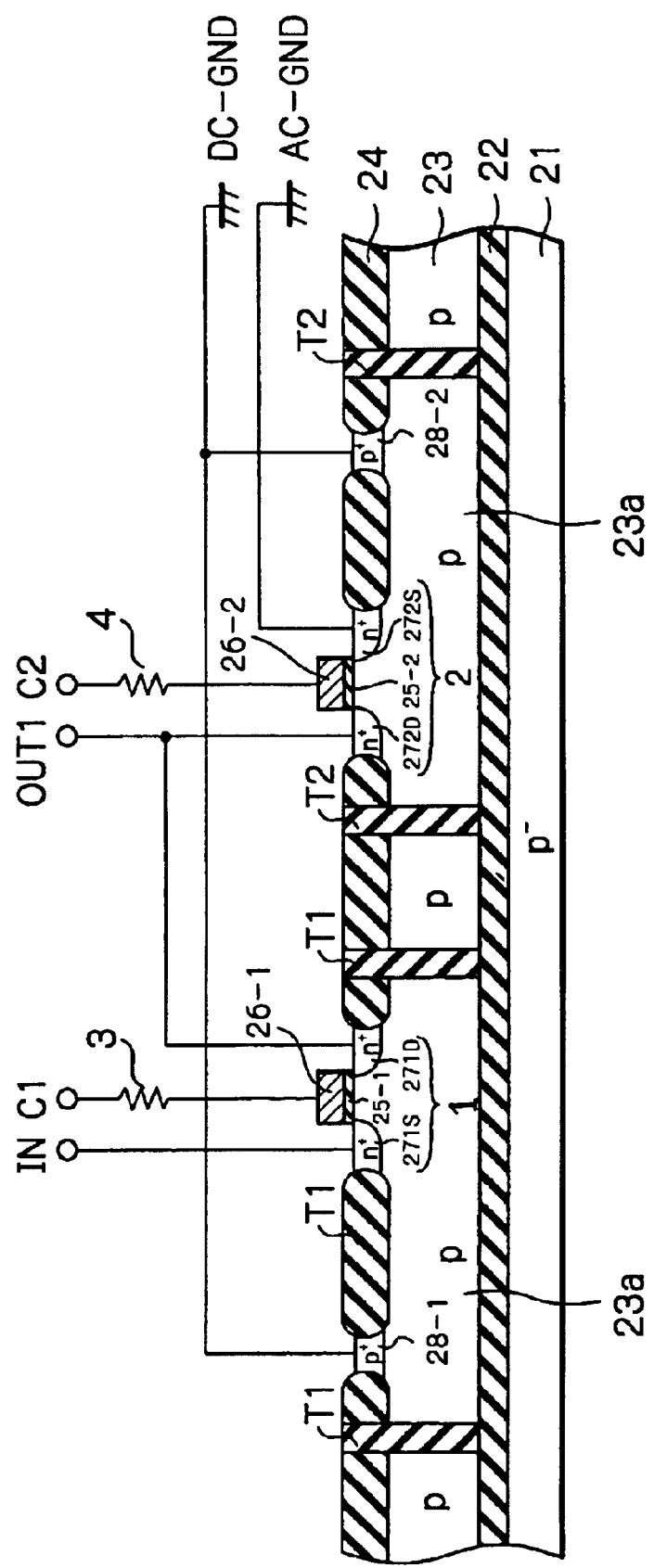
FIG. 15 is a cross-sectional view illustrating a modification of the semiconductor switch apparatus of FIG. 14.

In FIG. 15, which illustrates a modification of the semiconductor switch apparatus of FIG. 14, instead of providing the regions 23a of FIG. 14, the distance between the n+-type impurity doped region 271S and the p+-type taken-out region 18-1 is made longer, and the distance between the n+-type impurity doped region 272S and the p+-type taken-out region 18-2 is made longer. Thus, the silicon layer 23 per se serves as the resistors 5 and 6 of FIGS. 8 and 9.

In FIGS. 7 and 12, the control voltages applied to the control terminals C1 and C2 are usually 0V and 3V. In this case, if the control voltages applied to the control terminals C1 and C2 are 3V and 0V, respectively, the MOS transistors 1 and 2 are expected to be completely turned ON and OFF, respectively. Also, if the amplitude of radio frequency signals applied to the input terminal IN is represented by $\Delta V_{in}$, $\Delta V_{in}/2$ is applied between the drain and gate of the MOS transistor 2. Therefore, if $\Delta V_{in}/2 > V_{th}$ where $V_{th}$ is a threshold voltage of the MOS transistor 2, the MOS transistor 2 would be turned ON.

Figure 16:
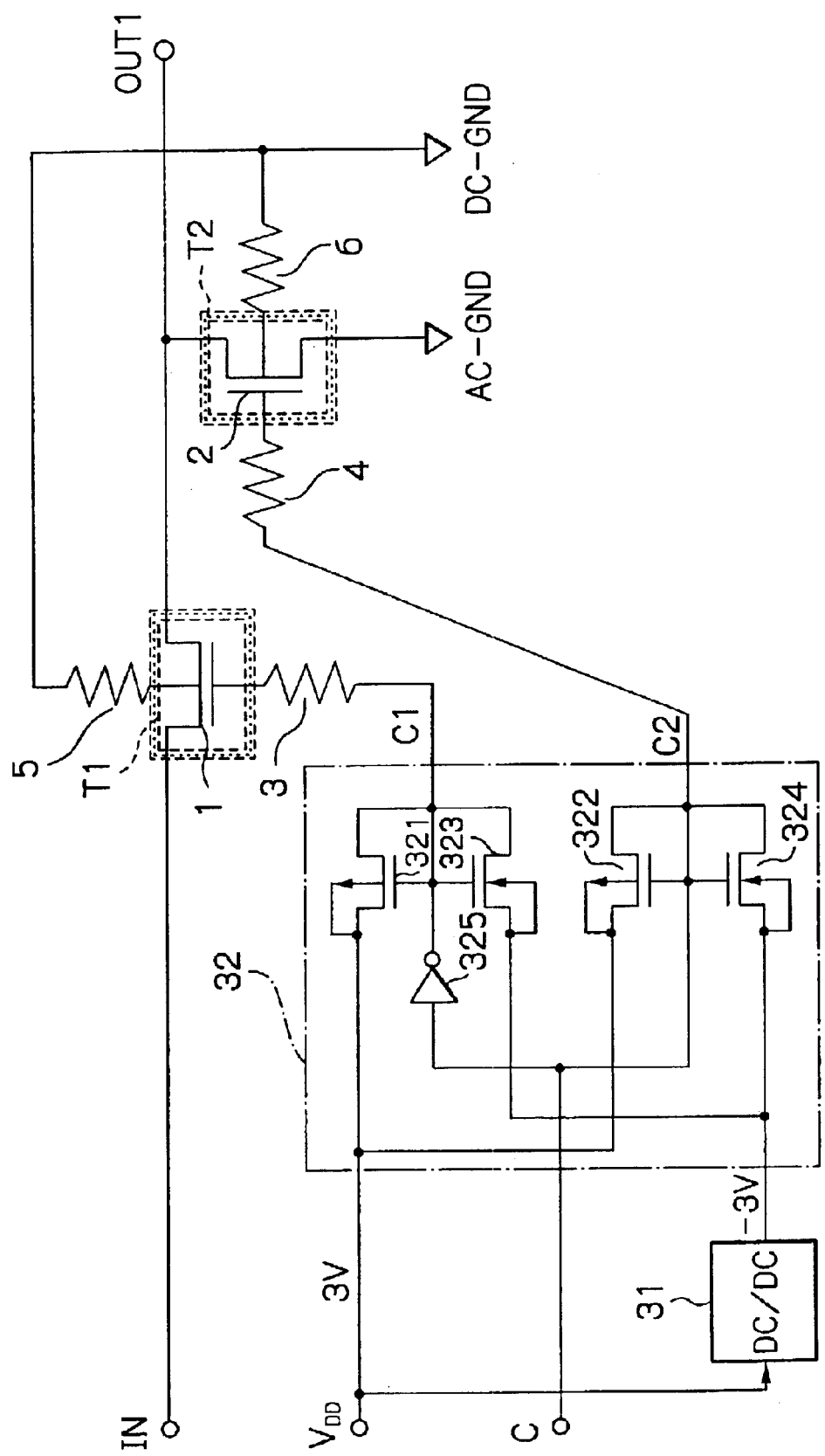
FIG. 16 is an equivalent circuit diagram illustrating a third embodiment of the semiconductor switch apparatus according to the present invention.

In FIG. 16, which illustrates a third embodiment of the semiconductor switch apparatus according to the present invention, a DC/DC converter 31 and a switching circuit 32 constructed by CMOS circuits are added to the elements of FIG. 7, thus surely turning OFF the MOS transistor 2. That is, the DC/DC converter 31 receives a power supply voltage $V_{DD}$ such as 3V and generates a voltage of −3V. Also, the switching circuit 32 receives the power supply voltage $V_{DD}$(3V) and the voltage −3V from the DC/DC converter 31 and generates the control signals (C1 and C2) whose voltages are 3V and −3V in accordance with a voltage applied to a control terminal C.

The switching circuit 32 is constructed by p-channel MOS transistors 321 and 322 having a threshold voltage of about 0.5V, N-channel MOS transistors 323 and 324 having a threshold voltage of about 3.5V, and an inverter 325.

When a high voltage such as 3V is applied to the control terminal C, the transistors 321, 322, 323 and 324 are turned ON, OFF, OFF and ON, respectively. As a result, the voltages at the terminals C1 and C2 are 3V and −3V, respectively, so that the MOS transistors 1 and 2 are turned ON and OFF, respectively. Therefore, a radio frequency signal can be transmitted from the input terminal IN via the MOS transistor 1 to the output terminal OUT1. In this case, since the gate voltage of the MOS transistor 2 is very low (−3V), the MOS transistor 2 is not turned ON even if the amplitude of radio frequency signals at the input terminal IN is large.

On the other hand, when a low voltage such as 0V is applied to the control terminal C, the transistors 321, 322, 323 and 324 are turned OFF, ON, ON and OFF respectively. As a result, the voltages at the terminals C1 and C2 are −3V and 3V, respectively, so that the MOS transistors 1 and 2 are turned OFF and ON, respectively.

Figure 17:
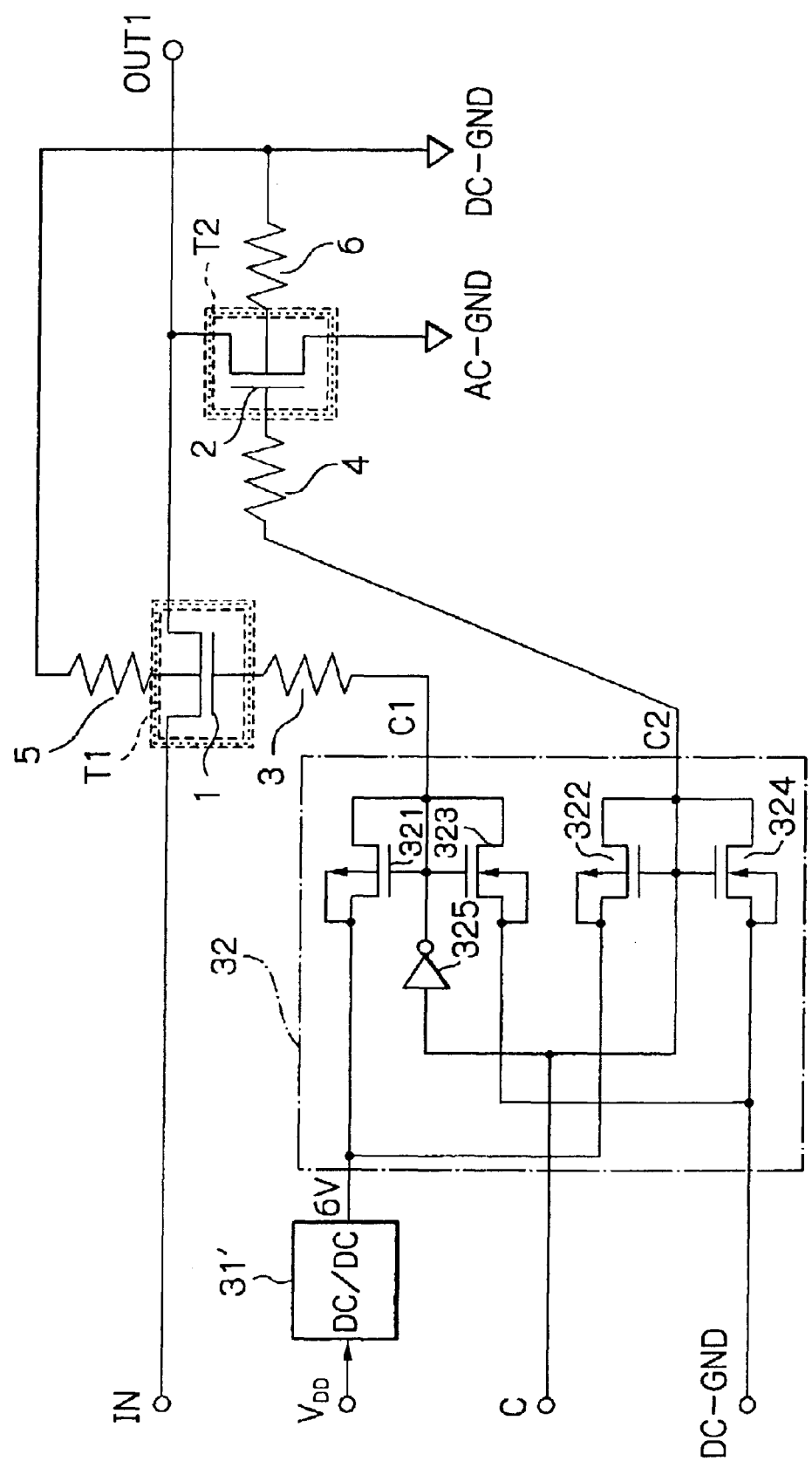
FIG. 17 is an equivalent circuit diagram illustrating a modification of the semiconductor switch apparatus of FIG. 16.

In FIG. 17, which illustrates a modification of the semiconductor switch apparatus of FIG. 16, a DC/DC converter 31' is provided instead of the DC/DC converter 31 of FIG. 16. That is, the DC/DC converter 31' receives the power supply voltage $V_{DD}$ such as 3V and generates a voltage of 6V. Also, in the switching circuit 32, the p-channel MOS transistors 321 and 322 have a threshold voltage of about 4V. Additionally, the threshold voltage of the N-channel MOS transistors 323 and 324 is made, for example, 1V.

When a high voltage such as 3V is applied to the control terminal C, the transistors 321, 322, 323 and 324 are turned ON, OFF, OFF and ON, respectively. As a result, the voltages at the terminals C1 and C2 are 6V and 0V, respectively, so that the MOS transistors 1 and 2 are turned ON and OFF, respectively. Therefore, a radio frequency signal can be transmitted from the input terminal IN via the MOS transistor 1 to the output terminal OUT1. In this case, since the threshold voltage of the MOS transistor 2 is very high (4V), the MOS transistor 2 would not turned ON even if the amplitude of radio frequency signals at the input terminal IN is large.

On the other hand, when a low voltage such as 0V is applied to the control terminal C, the transistors 321, 322, 323 and 324 are turned OFF, ON, ON and OFF respectively. As a result, the voltages at the terminals C1 and C2 are 0V and 6V, respectively, so that the MOS transistors 1 and 2 are turned OFF and ON, respectively.

Figure 18:
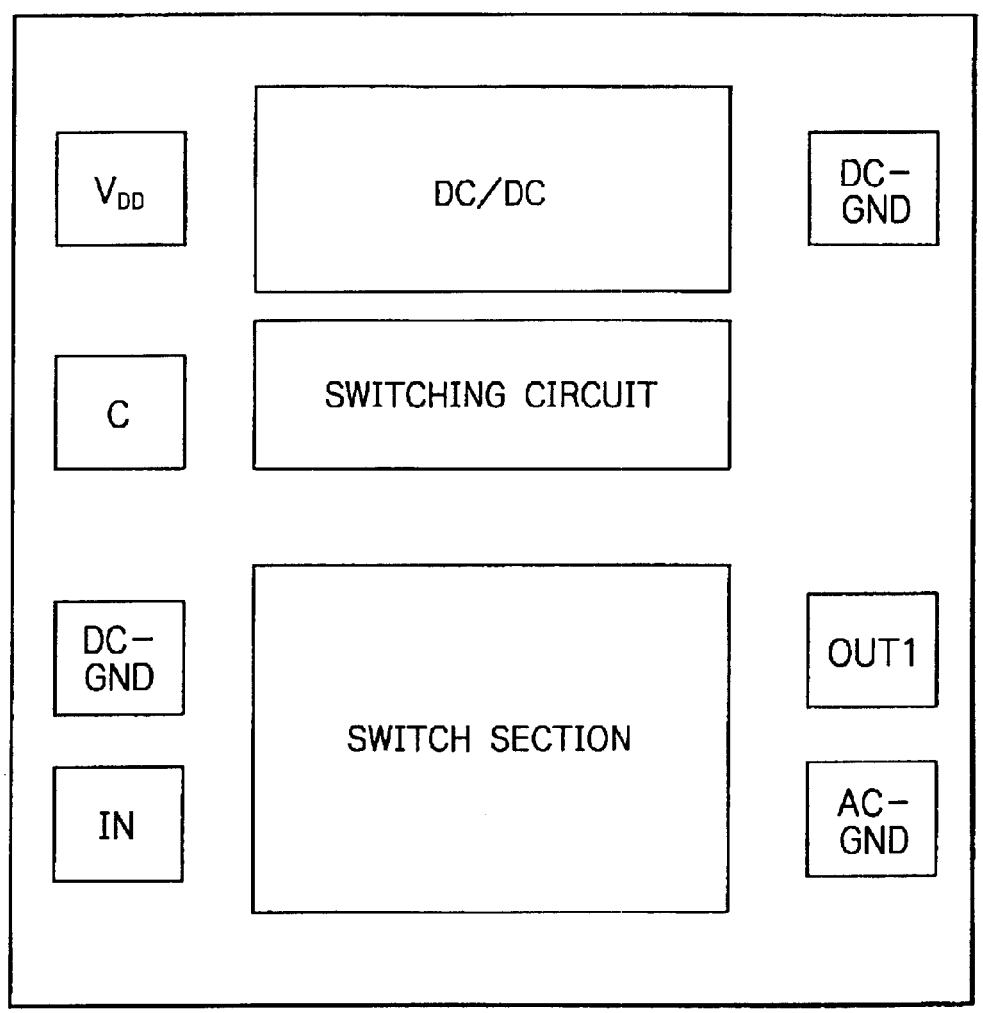
FIG. 18 is a layout diagram of the semiconductor switch apparatuses of FIGS. 16 and 17.

The DC—DC converter 31 or 31' and the switching circuit 32 can be applied to the semiconductor switch apparatus of FIG. 18.

According to the simulation carried out by the inventor, when the semiconductor switch apparatus of FIG. 16 without the DC—DC converter 31 and the switching circuit 32 was applied to an SPDT switch using four MOS transistors corresponding to the MOS transistors 1 and 2 of FIG. 16, the input power at 0.1 dB compression point was 12.9 dBm. Contrary to this, when the semiconductor switch apparatus of FIG. 16 with the DC/DC converter 31 and the switching circuit 32 is applied to such an SPDT switch, the input power at 0.1 dB compression point was 27.3 dBm, thus improving the power characteristics.

The layout of the semiconductor switch apparatuses of FIGS. 16 and 17 is illustrated in FIG. 18, and realized by silicon technology.

Figure 19:
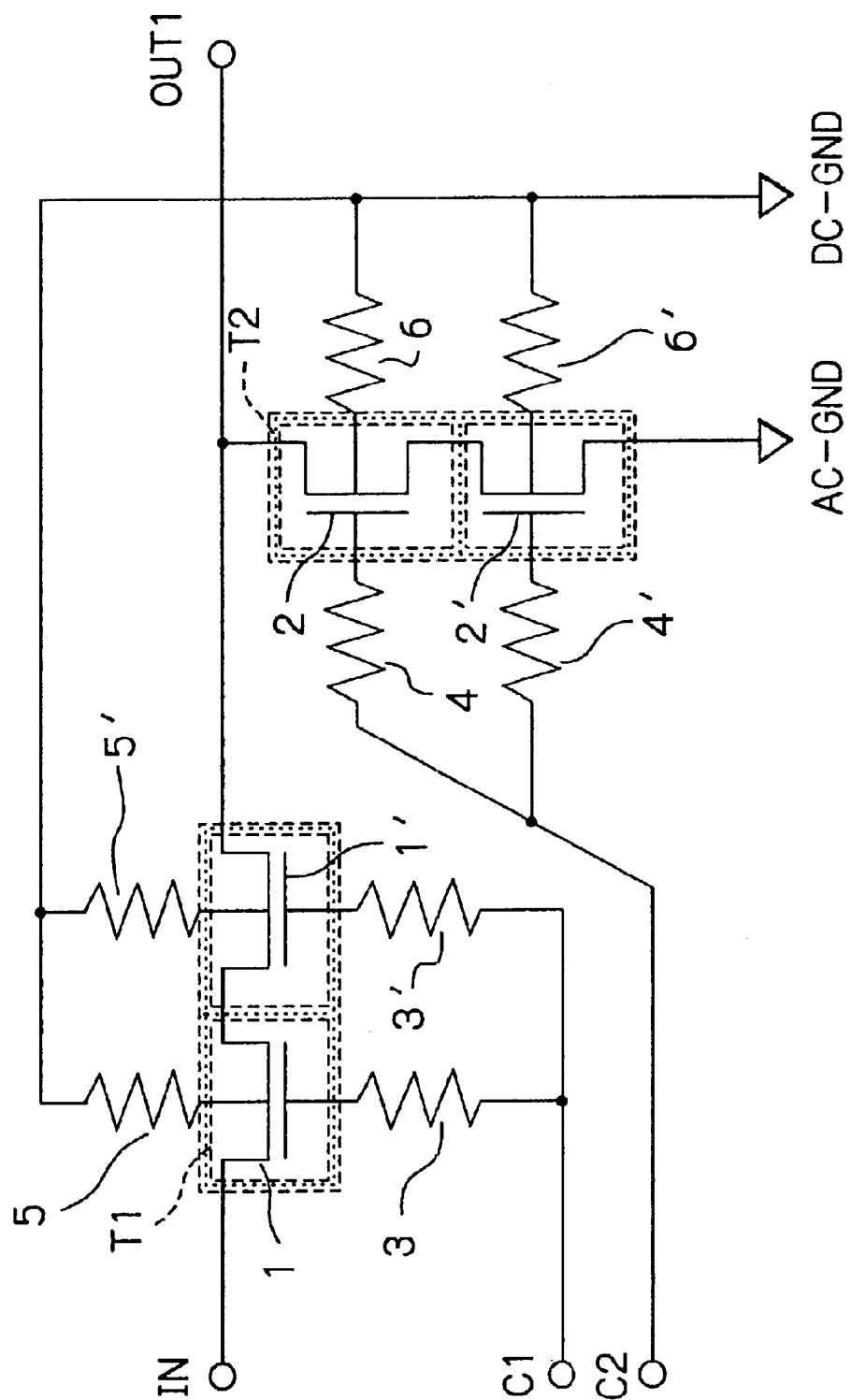
FIG. 19 is an equivalent circuit diagram illustrating a fourth embodiment of the semiconductor switch apparatus according to the present invention.

In FIG. 19, which illustrates a fourth embodiment of the semiconductor switch apparatus according to the present invention, a series MOS transistor 1' along with its gate protection resistor 3' and a resistor 5' is connected in series to the series MOS transistor 1 of FIG. 7, and a shunt MOS transistor 2' along with its gate protection resistor 4' and a resistor 6' is connected in series to the shunt MOS transistor 2 of FIG. 7.

In FIG. 19, since the shunt MOS transistors 2 and 2' are connected in series, if the amplitude of radio frequency signals applied to the input terminal IN is represented by $\Delta V_{in}$, $\Delta V_{in}/4$ is applied between the drain and gate of each of the MOS transistor 2 and 2'. Therefore, unless $\Delta V_{in}/4 > V_{th}$ where $V_{th}$ is a threshold voltage of the MOS transistors 2 and 2', the MOS transistors 2 and 2' would not be turned ON under the condition that the voltage at the control terminal C2 is 0V.

Figure 20:
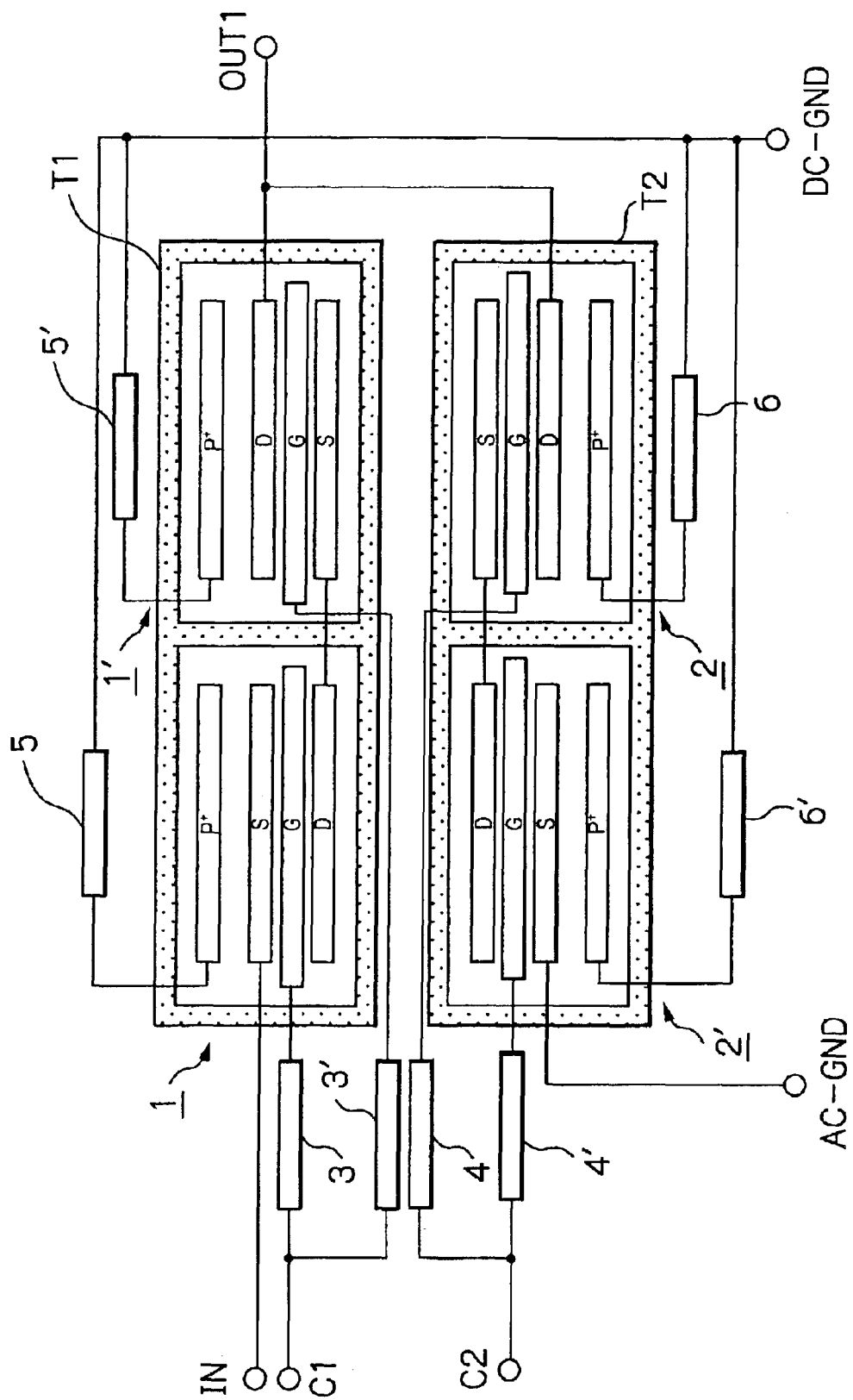
FIG. 20 is a plan view of the semiconductor switch apparatus of FIG. 18.

In FIG. 20, which is a plan view of the semiconductor switch apparatus of FIG. 19, each of the MOS transistors 1, 1', 2 and 2' is isolated by the trench insulating layers T1 and T2, so that the leakage of radio frequency signals from the silicon layer 23 of the MOS transistor 1 to that of the MOS transistor 1' and the leakage of radio frequency signals from the silicon layer 23 of the MOS transistor 2 to that of the MOS transistor 2' can be sufficiently suppressed.

Figure 21:
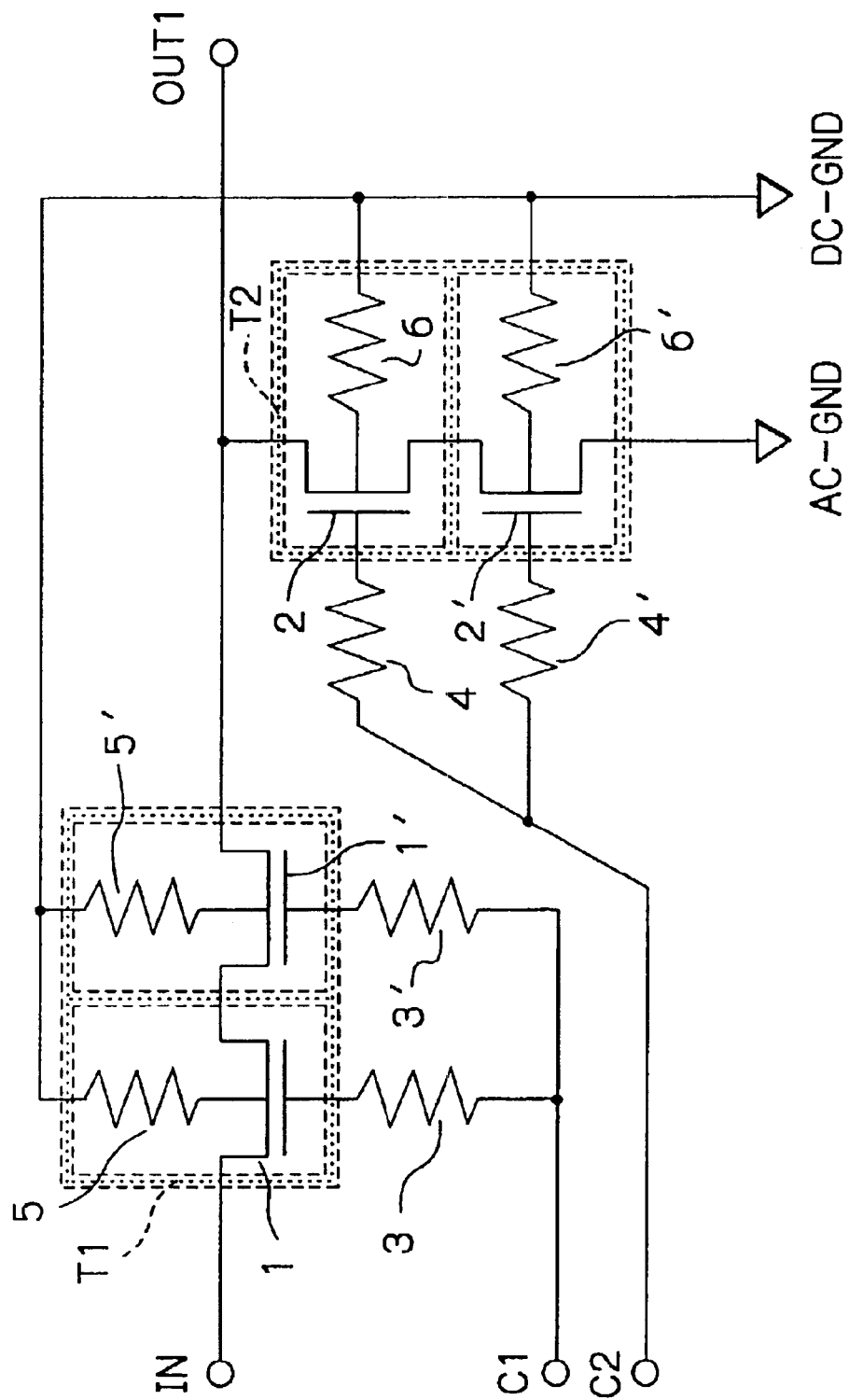
FIG. 21 is an equivalent circuit diagram illustrating a fifth embodiment of the semiconductor switch apparatus according to the present invention.
Figure 22:
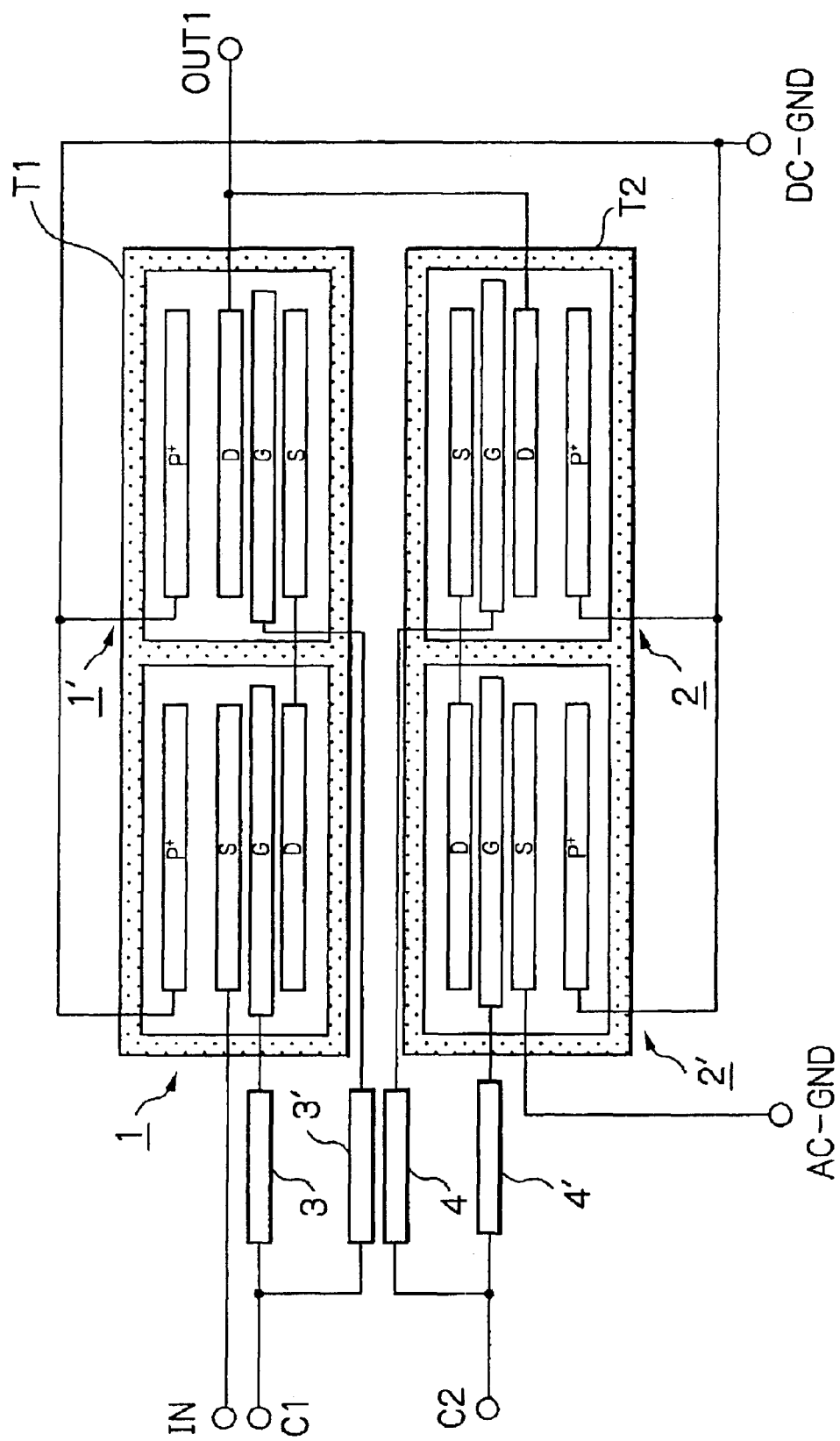
FIG. 22 is a plan view of the semiconductor switch apparatus of FIG. 21.
Figure 23:
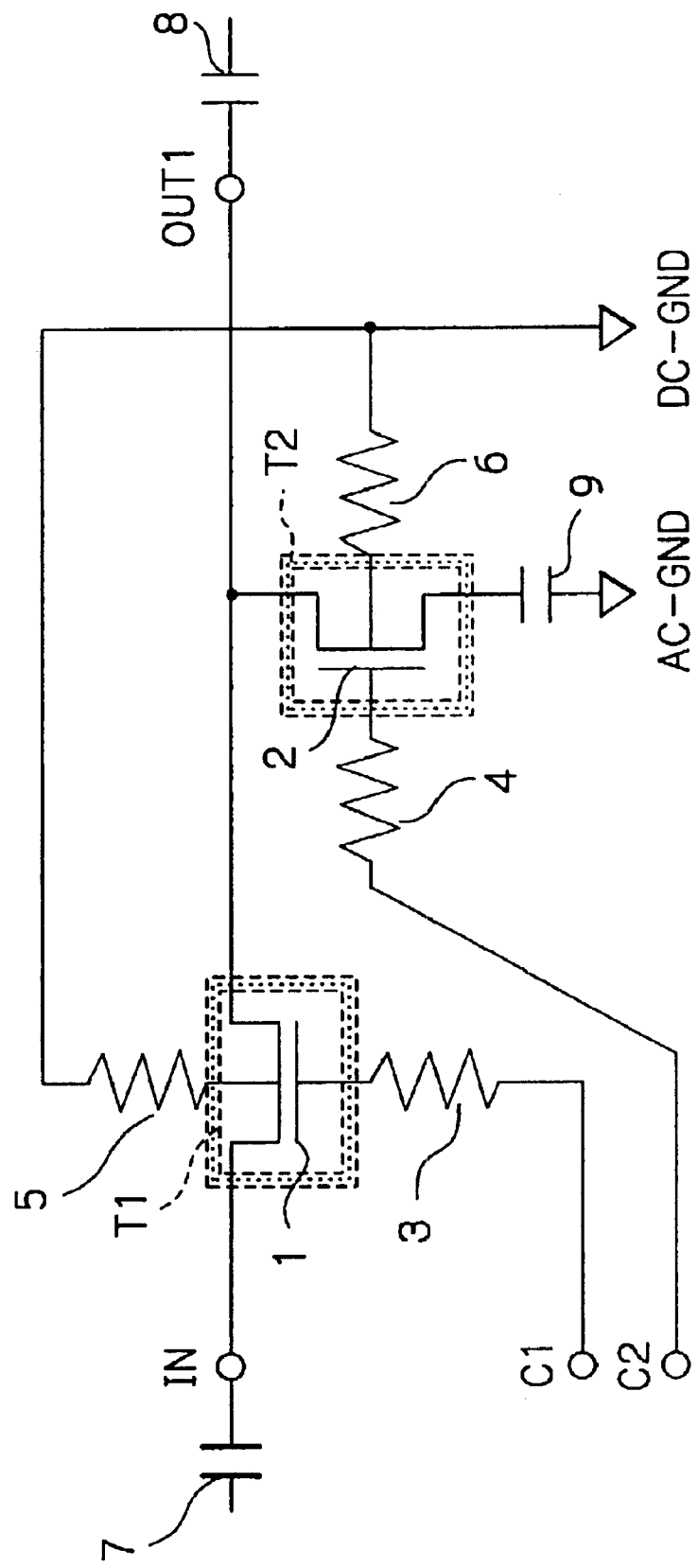
FIG. 23 is an equivalent circuit diagram illustrating a modification of the semiconductor switch apparatus of FIG. 7.

In FIG. 21, which illustrates a fifth embodiment of the semiconductor switch apparatus according to the present invention, the resistors 5 and 5' as well as the MOS transistors 1 and 1' are isolated by the trench insulating layer T1, and the resistors 6 and 6' as well as the MOS transistors 2 and 2' are isolated by the trench insulating layer T2, thus surely preventing radio frequency signals from superposing on each other. In this case, as illustrated in FIG. 22 which corresponds to FIG. 13, the resistors 5, 5', 6 and 6' are formed in the same way as in FIG. 14 or 15.

In FIGS. 19, 20, 21 and 22, note that three or more series MOS transistors can be connected in series and three or more shunt MOS transistors can be connected in series.

In the above-described embodiments, a series capacitor for DC cut can be externally provided at the input terminal IN and the output terminal OUT1, and a shunt capacitor for AC cut can be internally provided at the shunt MOS transistor 2. For example, in the semiconductor switch apparatus of FIG. 7, series capacitors 7 and 8 are connected to the input terminal IN and the output terminal OUT1, respectively, and a shunt capacitor 9 is connected between the shunt MOS transistor 2 and the AC ground terminal AC-GND. In this case, the shunt capacitor 9 is constructed by a metal-insulator-metal (MIM) capacitance or a MOS capacitance.

Additionally, although the above-described embodiments relate to an SPST switch, the present invention can be easily applied to an SPDT switch which is constructed by two SPST switches (see: FIGS. 1B and 2B).

Further, in the above-described embodiments, although the shunt MOS transistor 2 (2') is connected to the output terminal OUT1, the shunt MOS transistor 2 (2') can be connected to the input terminal IN (see: FIGS. 2A and 2B).

As explained hereinabove, according to the present invention, since a series MOS transistor and a shunt MOS transistor are isolated by trench insulating layers, the leakage of radio frequency signals can be further suppressed, that is, the transmission loss of radio frequency signals can be further suppressed.

What is claimed is:

1. A semiconductor switch apparatus, comprising:
an input terminal;
an output terminal;
an AC around terminal;
a DC around terminal;
a semiconductor substrate;
an insulating layer formed on said semiconductor substrate;
a semiconductor layer formed on said insulating layer;
at least one series MOS transistor formed within a first region of said semiconductor layer and connected between said input terminal and said output terminal;
at least one shunt MOS transistor formed within a second region of said semiconductor layer and connected between (a) one of said input terminal and said output terminal and (b) said AC around terminal, said shunt MOS transistor being operated complementarily with said series MOS transistor;
a first trench insulating layer surrounding said series MOS transistor;
a second trench insulating layer surrounding said shunt MOS transistor;
a control terminal;
a power supply terminal for generating a first power supply voltage;
a DC/DC converter, connected to said power supply terminal, for generating a second power supply voltage; and
a switching circuit, connected to said control terminal, said power supply terminal and said DC/DC converter, for generating first and second complementary control signals in accordance with a voltage at said control terminal and transmitting said first and second complementary control signals to gates of said series MOS transistor and said shunt MOS transistor, respectively,
one of said first and second complementary control signals being said first power supply voltage, the other of said first and second complementary control signals being said second power supply voltage.

2. A semiconductor switch apparatus, comprising:
an input terminal;
an output terminal;
an AC ground terminal;
a DC ground terminal;
a semiconductor substrate;
an insulating layer formed on said semiconductor substrate;
a semiconductor layer formed on said insulating layer;
at least one series MOS transistor formed within a first region of said semiconductor layer and connected between said input terminal and said output terminal;
at least one shunt MOS transistor formed within a second region of said semiconductor layer and connected between (a) one of said input terminal and said output terminal and (b) said AC ground terminal, said shunt MOS transistor being operated complementarily with said series MOS transistor;
a first trench insulating layer surrounding said series MOS transistor;
a second trench insulating layer surrounding said shunt MOS transistor;
a control terminal;
a power supply terminal for generating a first power supply voltage;
a DC/DC converter, connected to said power supply terminal, for generating a second power supply voltage; and
a switching circuit, connected to said control terminal, said DC/DC converter and said DC ground terminal, for generating first and second complementary control signals in accordance with a voltage at said control terminal and transmitting said first and second complementary control signals to gates of said series MOS transistor and said shunt MOS transistor, respectively,
one of said first and second complementary control signals being said second power supply voltage, the other of said first and second complementary control signals being a voltage at said DC ground terminal.

3. A semiconductor switch apparatus comprising:
an input terminal;
an output terminal;
an AC ground terminal;
a DC ground terminal;
a semiconductor substrate;
an insulating layer formed on said semiconductor substrate;
a semiconductor layer formed on said insulating layer;
a plurality of series MOS transistors formed within a first region of said semiconductor layer and connected in series between said input terminal and said output terminal;
a plurality of shunt MOS transistors formed within a second region of said semiconductor layer and connected in series between (a) one of said input terminal and said output terminal and (b) said AC ground terminal, said shunt MOS transistors being operated complementarily with said series MOS transistors;
a first trench insulating layer surrounding said series MOS transistors; and
a second trench insulating layer surrounding said shunt MOS transistors.

4. The semiconductor switch apparatus as set forth in claim 3, further comprising:
   a plurality of first resistors, each first resistor connected between a back gate of one of said series MOS transistors and said DC ground terminal; and
   a plurality of second resistors, each second resistor connected between a back gate of one of said shunt MOS transistors and said DC ground terminal.

5. The semiconductor switch apparatus as set forth in claim 4, wherein the resistance value of each said first and second resistors is from about 500Ω to about 10 MΩ.

6. The semiconductor switch apparatus as set forth in claim 4, wherein:
   each of said first resistors is located outside of said first trench insulating layer, and
   each of said second resistors is located outside of said second trench insulating layer.

7. The semiconductor switch apparatus as set forth in claim 4, wherein:
   each of said first resistors is located inside of said first trench insulating layer, and
   each of said second resistors is located inside of said second trench insulating layer.

8. The semiconductor switch apparatus as set forth in claim 7, wherein:
   each of said first resistors comprises a low impurity concentration region within the first region of said semiconductor layer, and
   each of said each of second resistors comprises a low impurity concentration region within the second region of said semiconductor layer.

9. The semiconductor switch apparatus as set forth in claim 7, wherein:
   each of said first resistors extends within the first region of said semiconductor layer, between a gate terminal and a second terminal of one of said series MOS transistors, and
   each of said second resistors extends within the second re on of said semiconductor layer, between a gate terminal and a second terminal of one of said shunt MOS transistors.

10. The semiconductor switch apparatus as set forth in claim 3, further comprising:
    a control terminal;
    a power supply terminal for generating a first power supply voltage;
    a DC/DC converter, connected to said power supply terminal, for generating a second power supply voltage; and
    a switching circuit, connected to said control terminal, said power supply terminal and said DC/DC converter, for generating first and second complementary control signals in accordance with a voltage at said control terminal and transmitting said first and second complementary control signals to gates of said series MOS transistors and said shunt MOS transistors, respectively,
    one of said first and second complementary control signals being said first power supply voltage, the other of said first and second complementary control signals being said second power supply voltage.

11. The semiconductor switch apparatus set forth in claim 3, comprising:
    a control terminal;
    a power supply terminal for generating a first power supply voltage;
    a DC/DC converter, connected to said power supply, terminal, for generating a second power supply voltage; and
    a switching circuit, connected to said control terminal, said DC/DC converter and said DC ground terminal, for generating first and second complementary control signals in accordance with a voltage at said control terminal and transmitting said first and second complementary control signals to gates of said series MOS transistors and said shunt MOS transistors, respectively,
    one of said first and second complementary control signals being said second power supply voltage, the other of said first and second complementary control signals being a voltage at said DC ground terminal.

12. The semiconductor switch apparatus as set forth in claim 3, wherein said apparatus comprises a single pole single throw type switch.

13. The semiconductor switch apparatus as set forth in claim 3, wherein said apparatus comprises a single pole double throw type switch.

* * * * *